(12) United States Patent
Hamada et al.

(10) Patent No.: US 6,329,269 B1
(45) Date of Patent: *Dec. 11, 2001

(54) SEMICONDUCTOR DEVICE MANUFACTURING WITH AMORPHOUS FILM CYRSTALLIZATION USING WET OXYGEN

(75) Inventors: Hiroki Hamada, Hirakata; Kiichi Hirano, Anpachi-gun; Akifumi Sasaki, Kobe, all of (JP)

(73) Assignee: Sanyo Electric Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/622,842

(22) Filed: Mar. 27, 1996

(30) Foreign Application Priority Data

Mar. 27, 1995 (JP) ................................................ 7-068253
Aug. 24, 1995 (JP) ................................................ 7-216150

(51) Int. Cl.$^7$ .............................. H01L 21/00; C30B 13/00
(52) U.S. Cl. ................................................ 438/486; 438/97
(58) Field of Search ................................ 438/166, 482, 438/486, 58, 96, 97, 488, 489

(56) References Cited

U.S. PATENT DOCUMENTS

| | | | |
|---|---|---|---|
| 4,507,181 | * 3/1985 | Nath et al. ............................ | 204/15 |
| 4,604,150 | * 8/1986 | Lin ...................................... | 148/188 |
| 5,130,264 | * 7/1992 | Troxell et al. ........................ | 437/40 |
| 5,210,050 | * 5/1993 | Yamazaki et al. . | |
| 5,266,509 | * 11/1993 | Chen ...................................... | 437/43 |
| 5,280,012 | * 1/1994 | Kirlin et al. ............................ | 505/1 |
| 5,395,457 | * 3/1995 | Sano et al. ............................ | 136/256 |
| 5,529,937 | * 6/1996 | Zhang et al. . | |
| 5,550,070 | * 8/1996 | Funai et al. . | |
| 5,568,288 | * 10/1996 | Yamazaki et al. .................... | 359/59 |
| 5,576,222 | * 11/1996 | Arai et al. ............................ | 437/4 |
| 5,610,430 | * 3/1997 | Yamashita et al. .................. | 257/412 |
| 5,668,663 | * 9/1997 | Varaprasad et al. ................ | 359/608 |
| 5,721,601 | * 2/1998 | Yamaji et al. ........................ | 349/138 |
| 5,766,994 | * 6/1998 | Tseng .................................. | 438/254 |
| 5,770,945 | * 6/1998 | Sato et al. ............................ | 438/238 |
| 5,861,337 | * 1/1999 | Zhang et al. . | |
| 5,923,962 | * 7/1999 | Ohtani et al. . | |
| 5,940,690 | * 8/1999 | Kusumoto et al. . | |

FOREIGN PATENT DOCUMENTS

| | | |
|---|---|---|
| 30338/1982 | 2/1982 | (JP) . |
| 58-15227A | * 1/1983 | (JP) . |
| 67046/1983 | 4/1983 | (JP) . |
| 405315249A | * 11/1993 | (JP) . |
| 406252153A | * 6/1994 | (JP) . |
| 6-252153 | * 9/1994 | (JP) . |

OTHER PUBLICATIONS

Ghandhi, The Theory and Practice of Microelectronics, 1968, John Wiley & Sons, p. 149.*
S. M. Sze, VLSI Technology, second edition, pp. 45–47, 98–99,111,131–132, 1988.*
Stanely Wolf and Richard N. Tauber, Silicon Processing for the VLSI Era, vol. 1, pp. 64–66, 207–208, 1986.*
Sorab K. Ghandhi, The Theory and Practice of Microelectronics, pp. 147–149, 1968.*

* cited by examiner

Primary Examiner—Charles Bowers
Assistant Examiner—Evan Pert
(74) Attorney, Agent, or Firm—Arent Fox Kintner Plotkin & Kahn, PLLC

(57) ABSTRACT

A method of fabricating a semiconductor device includes the steps of forming an amorphous semiconductor film on a substrate, oxidizing the surface of the amorphous semiconductor film in an atmosphere containing water vapor and oxygen, and removing the oxide film which is formed on the surface of the semiconductor film.

8 Claims, 16 Drawing Sheets

(a)

(b)

(c)

(d)

(e)

(f)

(g)

(h)

(i)

(a)

(b)

(c)

(d)

(a)

(b)

(c)

(d)

(f)

(g)

(h)

(i)

SEMICONDUCTOR DEVICE MANUFACTURING WITH AMORPHOUS FILM CYRSTALLIZATION USING WET OXYGEN

BACKGROUND OF THE INVENTION

1. Field of the Invention

The present invention relates to a method of treating a semiconductor film and a method of fabricating a semiconductor device, and more particularly, it relates to a method of treating a semiconductor film of amorphous silicon or the like which can reduce impurity concentration and a method of fabricating a semiconductor device with the semiconductor film.

2. Description of the Background Art

In recent years, a semiconductor device employing a semiconductor layer of polycrystalline silicon which is much higher in carrier mobility than amorphous silicon has attracted much attention. Such a semiconductor device includes a thin film transistor (TFT).

A conventional method of fabricating a thin film transistor employing the so-called solid-phase epitaxy of obtaining a polycrystalline silicon film by epitaxially growing an amorphous silicon film in a solid phase. FIGS. 17(a) to 17(e) and 18(f) to 18(i) illustrate steps of fabricating a thin film transistor which is employed as a pixel driving element of a conventional liquid crystal display.

First, a quartz substrate 101 is prepared, as shown in FIG. 17(a).

Then, an amorphous silicon film 102 is formed on the quartz substrate 101 by CVD (chemical vapor deposition) under conditions of a temperature of 500 to 600° C. and an $SiH_4$ flow rate of 50 sccm, as shown in FIG. 17(b).

Further, the amorphous silicon film 102 is epitaxially grown in a solid phase in an atmosphere of nitrogen gas which is inert gas, to obtain a polycrystalline silicon film 103, as shown in FIG. 17(c). The conditions for the solid-phase epitaxy are $N_2$ gas of 4 l/min., a temperature of 500 to 650° C., and a time of several hours to 100 hours.

Then, a gate insulating film 105 is formed on the polycrystalline silicon film 103, as shown in FIG. 17(d).

Further, a polycrystalline silicon film for defining a gate electrode 106 is formed on the gate insulating film 105 by thermal CVD, as shown in FIG. 17(e). A heat treatment is performed in an $N_2$ atmosphere at a temperature of 1050° C. for 60 minutes, and thereafter the polycrystalline silicon film is patterned to form the gate electrode 106. This gate electrode 106 may alternatively be prepared from a metal such as aluminum (Al) or chromium (Cr), by vapor deposition or sputtering.

Thereafter holes 107 are formed in the gate insulating film 105 by anisotropic etching, as shown in FIG. 18(f). An n-type impurity 108 such as phosphorus (P) is doped by ion implantation or the like, and thereafter a heat treatment is performed in an $N_2$ atmosphere at a temperature of 900° C. for 30 minutes, for forming n-type drain and source regions 109 and 110 in the polycrystalline silicon film 103.

Further, a storage capacitive electrode 111 consisting of ITO (indium tin oxide) or the like is formed on a pixel part region of the quartz substrate 101 by sputtering, as shown in FIG. 18(g).

Further, a gate electrode 112 consisting of a metal such as molybdenum (Mo), metal silicide or polycrystalline silicon is formed on the gate electrode 106 by sputtering, as shown in FIG. 18(h). Further, an interlayer insulating film 113 consisting of silicon nitride or the like is formed on the overall surface, and the interlayer insulating film 113 is partially removed by etching or the like, for forming contact holes 114 on the drain and source regions 109 and 110.

Thereafter a pixel electrode 115 consisting of ITO is formed on the interlayer insulating film 113 located on the pixel part by sputtering, as shown in FIG. 18(i). The pixel electrode 115 is electrically connected with the source region 110 through the contact hole 114. Further, a conductive film is formed on the overall surface and patterned, thereby forming a drain electrode 116 and a source electrode 117 which are connected to the drain region 109 and the source region 110 respectively.

Through the aforementioned steps, a polycrystalline silicon TFT serving as a pixel driving element of a liquid crystal display (LCD) is completed.

As hereinabove described, the conventional TFT employs a polycrystalline silicon film which is formed by solid-phase epitaxy under an inert gas atmosphere as an active layer. When solid-phase epitaxy of the amorphous silicon film is made in an atmosphere of inert gas such as nitrogen gas, however, the surface of the polycrystalline silicon film is extremely irregularized.

FIG. 19 is a characteristic diagram showing surface roughness of a polycrystalline silicon film which is formed from an amorphous silicon film prepared from silane ($SiH_4$) gas through AFM (atomic force microscopy). As shown in FIG. 19, the mean surface roughness of the polycrystalline silicon film is 4.85 Å while the maximum irregularity (difference between maximum and minimum values) is 19.5 Å. Thus, it is understood that the surface is extremely stepped. When such a polycrystalline silicon film is employed as an active layer of a thin film transistor, carriers are disadvantageously scattered by the irregular surface of the polycrystalline silicon film, to deteriorate drivability of the thin film transistor.

To this end, there has been studied a method of polishing such an irregular surface of the polycrystalline silicon film (Appl. Phys. Lett., Vol. 64, No. 17, pp. 2273–2275, Apr. 25, 1994).

According to this method, an amorphous silicon film is formed on an $SiO_2$ film, which is formed by thermal oxidation, by low pressure CVD, and converted into a polycrystalline silicon film. Then the surface of the polycrystalline silicon film is flattened by mechanical or chemical polishing, and thereafter the flattened polycrystalline silicon film is employed as an active layer of a TFT.

In order to carry out the mechanical or chemical polishing, however, an expensive machine is necessary and sufficient care is required for maintenance/management of the polishing machine for continually maintaining the machine in the same condition. Thus, the fabrication cost is disadvantageously increased.

Further, the polycrystalline silicon film which is formed by the aforementioned method contains an impurity such as oxygen. It is preferable to minimize the concentration of such an impurity, which causes crystal defects etc. in the film. However, it is known in the art that reduction of impurity concentration such as oxygen concentration is limited in a fabrication process employing the present film forming device such as a CVD device, for example, and that reduction of oxygen concentration is particularly difficult. For example, the lower limit of reduction in oxygen concentration during film formation is about $10^{19}$ $cm^{-3}$ in a plasma CVD device, an LP-CVD (low pressure CVD)

device or the like. Therefore, a polycrystalline silicon film which is obtained by solidphase epitaxy after formation of an amorphous silicon film contains a large quantity of oxygen which is an impurity, and the characteristics of a TFT are deteriorated by crystal defects resulting from the presence of oxygen.

SUMMARY OF THE INVENTION

A first object of the present invention is to provide a method of fabricating a semiconductor device which can smooth the surface of a semiconductor film crystallized from an amorphous state.

A second object of the present invention is to provide a method of treating a semiconductor film which can reduce impurity concentration in the semiconductor film and a method of fabricating a semiconductor device.

A method of fabricating a semiconductor device according to a first aspect of the present invention comprises the step of forming a polycrystalline silicon film by supplying external energy in an atmosphere containing gas which contains at least one oxygen.

According to the first aspect, the external energy is preferably supplied by solid-phase epitaxy or melt recrystallization.

In a preferred embodiment according to the first aspect, the method comprises the steps of forming an amorphous silicon film on a semiconductor substrate or an insulating substrate, and forming a polycrystalline silicon film by performing solid-phase epitaxy or melt recrystallization of the amorphous silicon film in an atmosphere at least containing gas containing that includes oxygen.

In the aforementioned embodiment, the method preferably further comprises a step of employing the polycrystalline silicon film as an active layer. A thin film transistor, an SRAM or a CCD can be fabricated by employing the polycrystalline film as an active layer.

The first aspect of the present invention includes the following subject matter:

(1) A method of fabricating a semiconductor device characterized in that a polycrystalline silicon film is formed by supplying external energy in an atmosphere containing gas containing at least the oxygen element.

(2) The method of fabricating a semiconductor device in accordance with the above item (1), wherein the external energy is supplied by solid-phase epitaxy or melt recrystallization.

(3) A method of fabricating a semiconductor device comprising the steps of forming an amorphous silicon film on a semiconductor substrate or an insulating substrate, and forming a polycrystalline silicon film by performing solid-phase epitaxy or melt recrystallization of the amorphous silicon in an atmosphere at least containing gas containing oxygen element.

(4) A thin film transistor employing a polycrystalline silicon film which is formed by the method of fabricating a semiconductor device according to any of the above items (1) to (3).

(5) An SRAM employing a polycrystalline silicon film which is formed by the method of fabricating a semiconductor device according to any of the above items (1) to (3).

(6) A CCD employing a polycrystalline silicon film which is formed by the method of fabricating a semiconductor device according to any of the above items (1) to (3).

(7) A method of fabricating a thin film transistor comprising the steps of:

forming a gate insulating film on a polycrystalline silicon film which is formed by the method of fabricating a semiconductor device according to any of the above items (1) to (3);

forming a gate electrode on the gate insulating film; and forming a source region and a drain region in the polycrystalline silicon film.

(8) The method of fabricating a thin film transistor in accordance with the above item (7), further comprising the steps of:

forming an interlayer insulating film on the overall surface of the device, forming contact holes in the interlayer insulating film to be in contact with the source and drain regions, and forming a source electrode and a drain electrode.

(9) A display employing the thin film transistor described in the above item (4) as a pixel driving element.

(10) A liquid crystal display employing the thin film transistor described in the above item (4) as a pixel driving element.

(11) A display employing a thin film transistor which is fabricated by the method of fabricating a thin film transistor described in the above item (7) or (8).

(12) A liquid crystal display employing a thin film transistor which is fabricated by the method of fabricating a thin film transistor described in the above item (7) or (8).

(13) A driver-integrated liquid crystal display employing a thin film transistor which is fabricated by the method of fabricating a thin film transistor described in the above item (7) or (8) as a pixel driving element of a driver-integrated liquid crystal display having a pixel part and a peripheral driving circuit part which are formed on the same substrate.

A method of treating a semiconductor film according to a second aspect of the present invention is characterized in that the surface of the semiconductor film is oxidized in an atmosphere containing water vapor.

In the treatment method according to the second aspect, the surface of the semiconductor is preferably oxidized in an atmosphere containing water vapor and oxygen.

Throughout the specification, the term "oxygen" in the wording "atmosphere containing water vapor and oxygen" includes not only oxygen gas but the oxygen element, and therefore the atmosphere may contain oxidative gas including the oxygen element such as $CO_2$ or $N_xO$.

In the method according to the second aspect, impurity concentration in the semiconductor film can be reduced by oxidizing the surface of the semiconductor film in an atmosphere containing water vapor or an atmosphere containing water vapor and oxygen.

In the treatment method according to the second aspect, the semiconductor film is preferably oxidized by a heat treatment.

In the treatment method according to the second aspect, the semiconductor film is preferably amorphous.

In the treatment method according to the second aspect, the semiconductor film is preferably oxidized by a heat treatment, so that the amorphous semiconductor film is crystallized by the heat treatment.

In the treatment method according to the second aspect, the amorphous semiconductor film is preferably crystallized by solid-phase epitaxy or melt recrystallization.

In the treatment method according to the second aspect, the semiconductor film is preferably a silicon film.

A method of fabricating a semiconductor device according to the second aspect of the present invention comprises the steps of forming an amorphous semiconductor film on a substrate, oxidizing the surface of the amorphous semiconductor film in an atmosphere containing water vapor, and removing an oxide film which is formed on the surface of the semiconductor film.

The method of fabricating a semiconductor device according to the second aspect preferably comprises the steps of forming an amorphous semiconductor film on a substrate, oxidizing the surface of the amorphous semiconductor film in an atmosphere containing water vapor and oxygen, and removing an oxide film which is formed on the semiconductor film.

A first embodiment of the method of fabricating a semiconductor device according to the second embodiment comprises the steps of forming an amorphous semiconductor film on a substrate, heat treating the amorphous semiconductor film in an atmosphere containing water vapor thereby crystallizing the amorphous semiconductor film and oxidizing its surface, and removing an oxide film from the surface of the semiconductor film.

The first embodiment of the method of fabricating a semiconductor device according to the second embodiment preferably comprises the steps of forming an amorphous semiconductor film on a substrate, heat treating the amorphous semiconductor film in an atmosphere containing water vapor and oxygen, thereby crystallizing the amorphous semiconductor film and oxidizing its surface, and removing an oxide film from the surface of the semiconductor film.

In the first embodiment of the method of fabricating a semiconductor device according to the second aspect, the amorphous semiconductor film is preferably crystallized by solid-phase epitaxy or melt recrystallization.

A second embodiment of the method of fabricating a semiconductor device according to the second aspect comprises the steps of forming an amorphous semiconductor film on a substrate, performing a heat treatment in an atmosphere containing water vapor at a temperature causing no crystallization of the amorphous semiconductor film thereby oxidizing its surface, and removing an oxide film from the surface of the semiconductor film.

The second embodiment of the method of fabricating a semiconductor device according to the second aspect preferably comprises the steps of forming an amorphous semiconductor film on a substrate, performing a heat treatment in an atmosphere containing water vapor oxygen at a temperature causing no crystallization of the amorphous semiconductor film thereby oxidizing its surface, and removing an oxide film from the surface of the semiconductor film.

The second embodiment of the method of fabricating a semiconductor device according to the second aspect preferably further comprises a step of heat treating the amorphous semiconductor film and crystallizing the same.

In the second embodiment of the method of fabricating a semiconductor device according to the second aspect, the heat treatment is performed by solid-phase epitaxy or melt recrystallization.

The second embodiment of the method of fabricating a semiconductor device according to the second aspect is preferably characterized in that the semiconductor film is a silicon film.

A thin film transistor according to the second aspect of the present invention employs a semiconductor film which is fabricated by the method according to the second aspect as an active layer.

A liquid crystal display according to the second aspect of the present invention employs the aforementioned thin film transistor according to the second aspect as a pixel driving element.

A driver-integrated liquid crystal display according to the second aspect of the present invention is a device comprising a pixel part and a peripheral driving circuit part both of which are formed on the same substrate, and employs the aforementioned thin film transistors according to the second aspect as driving elements for the pixel part and the peripheral circuit part respectively.

A photovoltaic device according to the second aspect of the present invention employs a semiconductor device which is fabricated by the method according to the second aspect as a photovoltaic transmittance layer.

A method of fabricating a thin film transistor according to the second aspect of the present invention, which is adapted to fabricate a thin film transistor having a semiconductor film prepared by forming an amorphous semiconductor film on a substrate and heat treating the amorphous semiconductor film thereby crystallizing the same as an active layer, comprises the steps of performing a heat treatment in an atmosphere containing water vapor, thereby crystallizing the amorphous semiconductor film and oxidizing its surface, and removing an oxide film from the surface of the semiconductor film.

The method of fabricating a thin film transistor according to the second aspect of the present invention, which is preferably adapted to fabricate a thin film transistor having a semiconductor film prepared by forming an amorphous semiconductor film on a substrate and heat treating the amorphous semiconductor film thereby crystallizing the same as an active layer, comprises the steps of performing a heat treatment in an atmosphere containing water vapor and oxygen, thereby crystallizing the amorphous semiconductor film and oxidizing its surface, and removing an oxide film from the surface of the semiconductor film.

A first method of fabricating a photovoltaic device according to the second aspect of the present invention, which is adapted to fabricate a photovoltaic device having a semiconductor film prepared by forming an amorphous semiconductor film on a substrate and heat treating the amorphous semiconductor film thereby crystallizing the same as a photovoltaic transmittance layer, comprises the steps of performing a heat treatment in an atmosphere containing water vaporthereby crystallizing the amorphous semiconductor film and oxidizing its surface, and removing an oxide film from the surface of the semiconductor film.

A second method of fabricating a photovoltaic device according to the second aspect of the present invention, which is adapted to fabricate a photovoltaic device employing an amorphous semiconductor film formed on a substrate as a photovoltaic transmittance layer, comprises the steps of performing a heat treatment in an atmosphere containing water vapor at a temperature causing no crystallization of the amorphous semiconductor film thereby oxidizing its surface, and removing an oxide film from the surface of the semiconductor film.

In each of the first and second methods of fabricating photovoltaic devices according to the second aspect of the present invention, the heat treatment is preferably performed in an atmosphere containing water vapor and oxygen.

Throughout the specification, the term "substrate" indicates not only a semiconductor substrate or an insulating substrate, but a substrate having an underlayer on which a semiconductor film is formed on its surface.

Further, the term "amorphous" may also indicate a microcrystalline state and a mixture state of microcrystalline and amorphous states. In addition, the semiconductor film to which the present invention is applied is not restricted to a silicon film, but includes a semiconductor film of a compound belonging to the group II–VI, III–V, IV—IV or the like.

According to the first aspect of the present invention, a semiconductor film such as a polycrystalline silicon film having a further flattened surface can be obtained as compared with the conventional method, whereby the characteristics of an element such as a TFT employing this semiconductor film can be improved.

According to the second aspect of the present invention, a semiconductor film such as a polycrystalline silicon film having a small content of oxygen which is an impurity can be readily formed also in a low temperature process in particular, whereby a semiconductor film of high quality can be obtained with small crystal defects.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
FIGS. 1(a) to 1(e) illustrate steps of fabricating a thin film transistor according to a first embodiment of the present invention.
Figure 1:
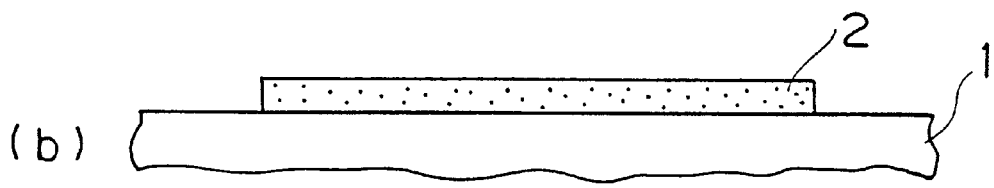
Figure 1:
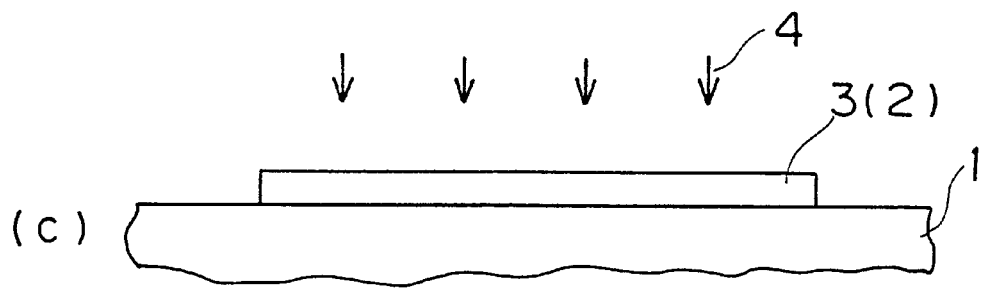
Figure 1:
Figure 1:
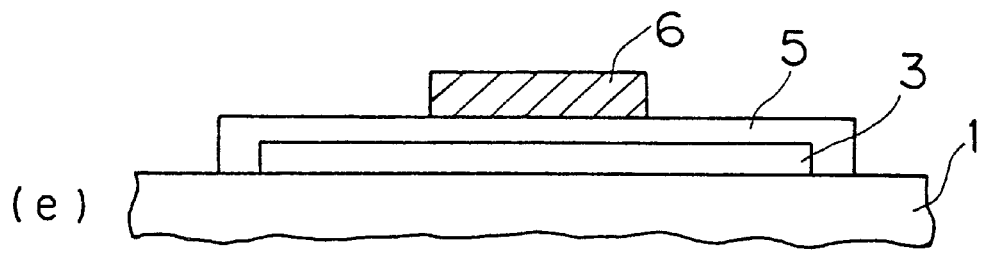

Embodiments of the present invention are now described.

The present invention provides a treatment or fabrication method which is related to improvement of the quality of a semiconductor film such as a polycrystalline silicon film, for example, and is widely applicable to a semiconductor device employing a semiconductor film or an applied device thereof. A treatment or fabrication method in case of employing a polycrystalline film as a semiconductor film is mainly described with reference to application to a liquid crystal display, a photovoltaic device etc. employing polycrystalline silicon films as active layers.

First Embodiment

FIGS. 1(a) to 1(e) and 2(f) to 2(i) are explanatory diagrams showing steps of fabricating a thin film transistor of a first embodiment according to the first aspect of the present invention. Description is now made on the case of applying the present invention to steps of fabricating a polycrystalline silicon thin film transistor which is employed as a switching element for each pixel of a pixel region of a liquid crystal display.

First, a semiconductor or insulating substrate 1 is prepared as shown in FIG. 1(a). The semiconductor substrate is formed by a silicon substrate or a gallium arsenide substrate. On the other hand, the insulating substrate includes a substrate consisting of any insulating material such as glass, quartz, heat-resistant glass, heat-resistant resin or ceramics, as well as a conductive substrate of a metal or the like provided with an insulating film such as a silicon film on its surface, and a semiconductive substrate provided with an insulating film such as a silicon oxide film on its surface.

Then, an amorphous silicon film 2 is formed on the substrate 1 by plasma CVD as shown in FIG. 1(b), under the following conditions:

Substrate Temperature: 500 to 600° C.

Gas Flow Rate: 50 sccm for $SiH_4$ and 40 sccm for $H_2$ RF Power: 40 W

The amorphous silicon film 2 can alternatively be formed by LP-CVD. In this case, film forming conditions are set as shown in Table 1, for example.

TABLE 1

| Raw Material Gas | $SiH_4$ | $Si_2H_6$ |
|---|---|---|
| Pressure | 0.6 Torr | 0.6 Torr |
| Substrate Temperature | 580° C. | 480° C. |
| Gas Flow Rate | 120 cc/min. | 80 cc/min. |
| Film Forming Rate | 60 Å/min. | 30 Å/min. |

Then, a heat treatment is performed to epitaxially grow the amorphous silicon film 2 in a solid phase for obtaining a polycrystalline silicon film 3, as shown in FIG. 1(c). This solid-phase epitaxy is made in an atmosphere containing gas 4 containing oxygen element. The heat treatment conditions are set as follows:

Substrate Temperature: 500 to 650° C.

Treatment Time: at least 10 hours

The oxygen element-containing gas 4 is prepared from $O_2$, $O_3$, CO, $CO_2$, NO, $N_2O$ or the like, for example. This polycrystalline silicon film 3 defines an active layer of a TFT.

Thereafter a heat treatment is performed, in order to reduce crystal defects in the polycrystalline silicon film 3. The heat treatment conditions depend on whether a high temperature process or a low temperature process is applied to fabrication of the polycrystalline silicon thin film transistor. When a high temperature process is applied while employing heat-resistant glass or quartz as the material for the substrate 1, for example, the heat treatment is performed in an $N_2$ atmosphere at a temperature of 1050° C. for 0.5 hours. When a low temperature process is applied while employing ordinary glass as the material for the substrate 1, on the other hand, the heat treatment is performed in an $N_2$ atmosphere at a temperature of 500 to 650° C. for 10 hours.

Further, a gate insulating film 5 is formed on the polycrystalline silicon film 3, as shown in FIG. 1(d). This gate insulating film 5 is formed by AP-CVD (atmospheric pressure CVD), LP-CVD (low pressure CVD) or sputtering.

In the case of AP-CVD, $O_2$ gas and $SiH_4$ gas are employed in the ratio $O_2/SiH_4$ of 3 to 10, and the film is formed at a temperature of 400 to 450° C. In the case of LP-CVD, $O_2$ gas and $SiH_4$ gas are employed in the ratio $O_2/SiH_4$ of 5 to 200, and the film is formed at a temperature of 400 to 450° C. In the case of sputtering, the film is formed under pressure of $5 \times 10^{-4}$ to $5 \times 10^{-3}$ Torr with RF power of 300 W.

Further, a polycrystalline silicon film is formed on the gate insulating film 5 by thermal CVD and patterned, thereby forming a gate electrode 6, as shown in FIG. 1(e). This gate electrode 6 may alternatively be prepared from a metal such as aluminum or chromium, for example, by vapor deposition or sputtering.

Figure 2:
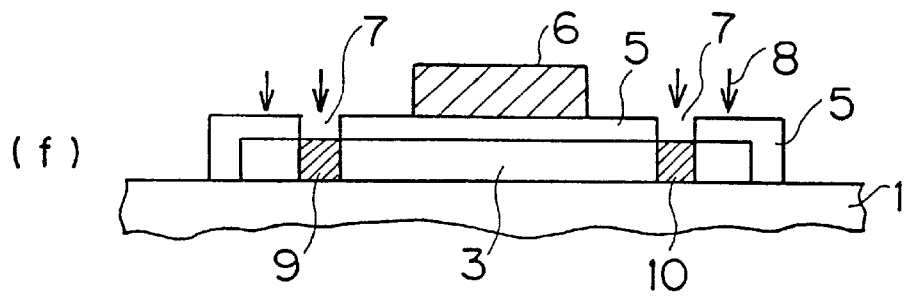
FIGS. 2(f) to 2(i) illustrate steps of fabricating a thin film transistor following those shown in FIGS. 1(a) to 1(e)
Figure 2:
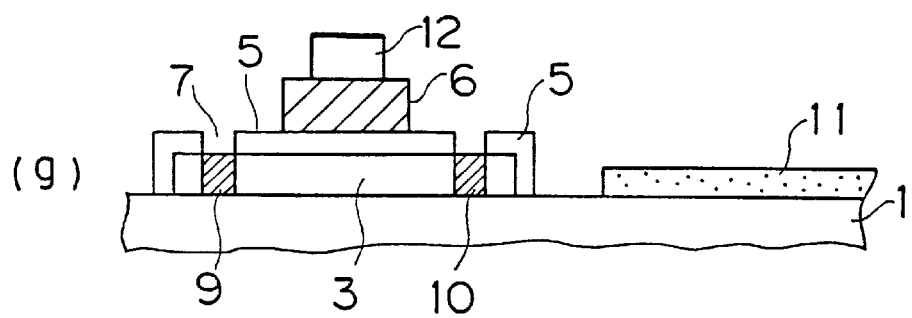
Figure 2:
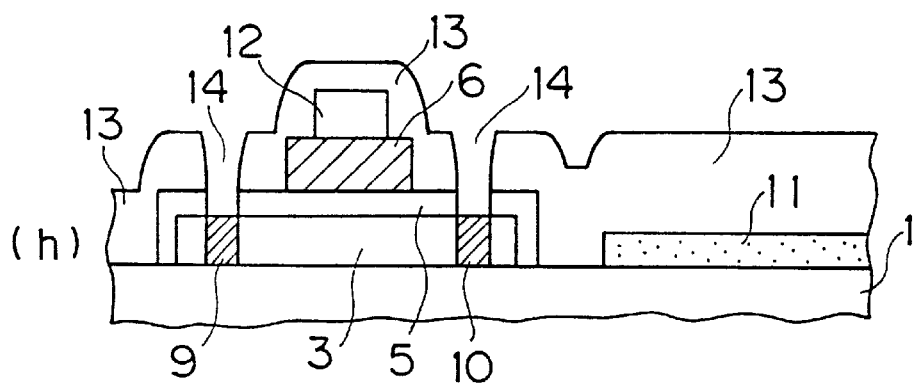
Figure 2:
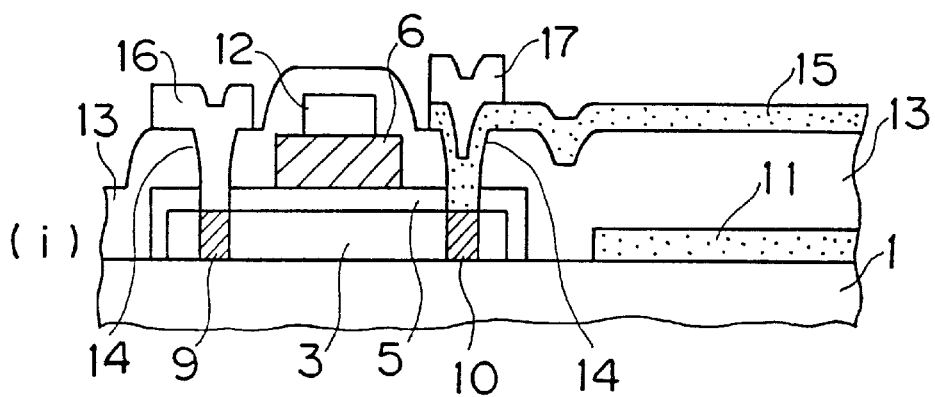

Further, holes 7 are formed in the gate insulating film 5 by anisotropic etching, as shown in FIG. 2(f). The polycrystalline silicon film 3 is doped with an n-type impurity 8 such as phosphorus by ion shower doping or the like, so that n-type drain and source regions 9 and 10 are formed therein. At the same time, the gate electrode 6 is also doped with an n-type impurity such as phosphorous. Thus, the gate electrode 6 is reduced in resistance.

Further, a storage capacitive electrode 11 consisting of ITO or the like is formed on a pixel region of the substrate 1, as shown in FIG. 2(g). Thereafter a gate wire 12 consisting of a metal such as molybdenum, metal silicide, or polycrystalline silicon is formed on the gate electrode 6 by sputtering.

Further, an interlayer insulating film 13 consisting of silicon nitride or the like is formed on the overall surface of the substrate 1, as shown in FIG. 2(h). The interlayer insulating film 13 is partially removed by etching, thereby forming contact holes 14 on the drain region 9 and the source region 10.

Then, a pixel electrode 15 consisting of ITO is formed on the interlayer insulating film 13 which is located on a pixel part by sputtering, as shown in FIG. 2(i). A part of the pixel electrode 15 is electrically connected with the source region 10 through the contact hole 14. Further, a conductive material is formed on the overall surface and thereafter patterned, so that a drain electrode 16 and a source electrode 17 are formed to be connected with the drain region 9 and the source region 10 respectively.

Thus, a polycrystalline silicon TFT serving as a pixel driving element of an LCD is completed.

When the amorphous silicon film is epitaxially grown in a solid phase in the gas atmosphere containing oxygen elements shown in FIG. 1(c), irregularity of the surface of the crystallized polycrystalline silicon film is reduced as compared with that formed by the conventional method, i.e., epitaxially grown in a solid phase in an inert gas atmosphere.

Figure 3:
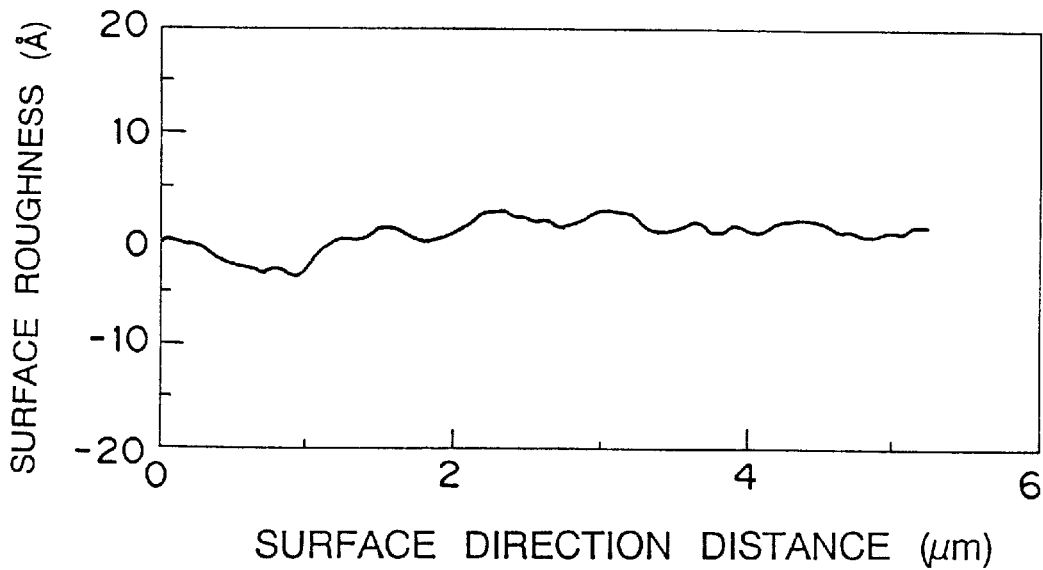
FIG. 3 is a characteristic diagram showing surface roughness of a polycrystalline silicon film of the thin film transistor fabricated through the steps shown in FIGS. 1(a) to 2(i)
Figure 19:
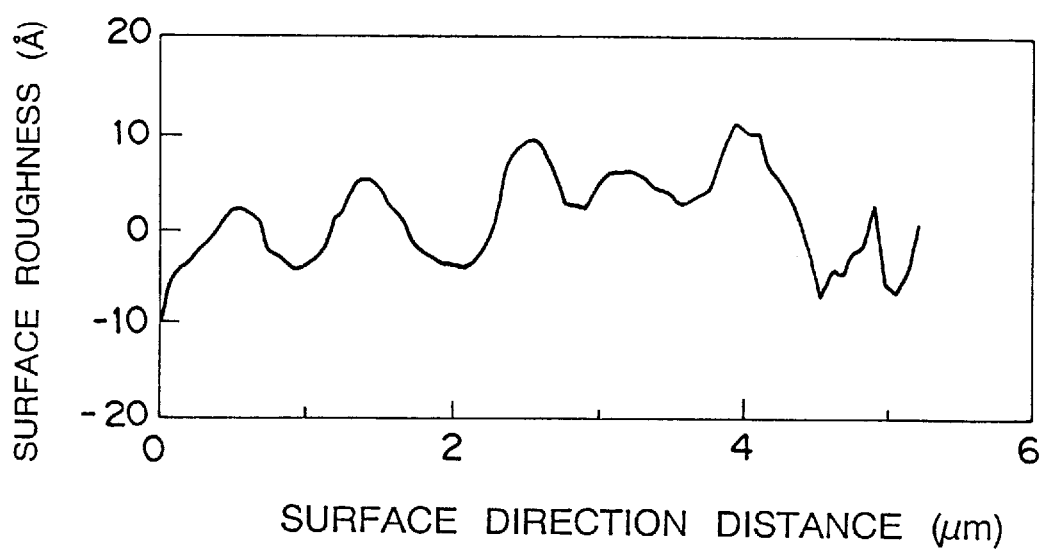
FIG. 19 illustrates surface roughness of a polycrystalline silicon film of the thin film transistor fabricated by the conventional method.

FIG. 3 is a characteristic diagram showing surface roughness of a polycrystalline film measured by AFM, in case of employing silane ($SiH_4$) gas as raw material gas for forming an amorphous silicon film. As clearly understood from FIG. 3, the surface roughness of the polycrystalline silicon film prepared in the aforementioned method is substantially homogeneous, with a mean value of about 1.82 Å. It is understood that this is an extremely small value as compared with the conventional case shown in FIG. 19.

Figure 4:
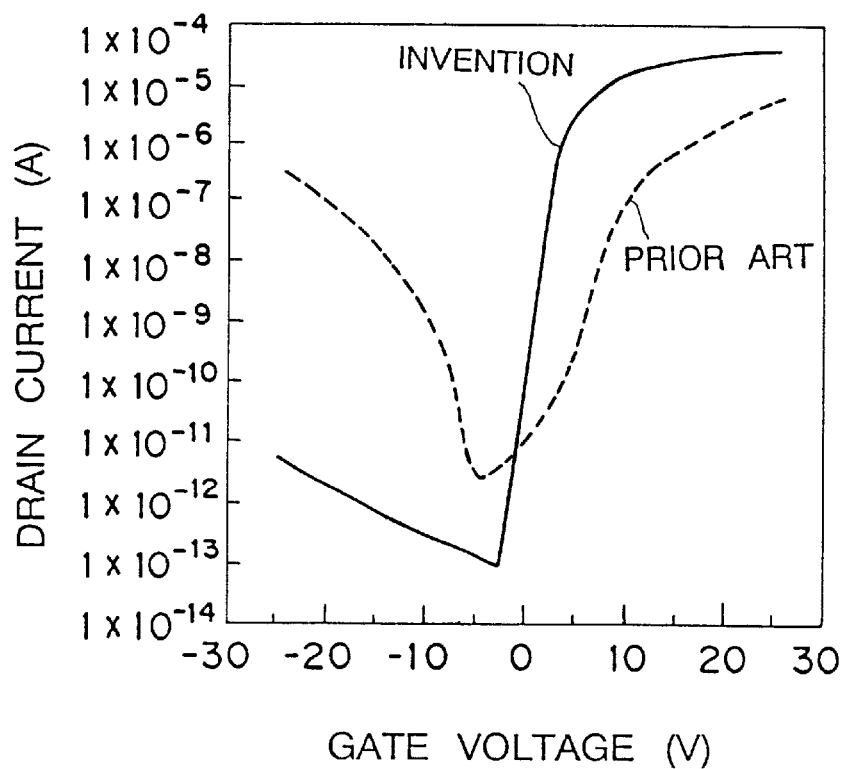
FIG. 4 is a gate voltage vs. drain current characteristic diagram of the thin film transistor according to the first embodiment of the present invention.

FIG. 4 is a characteristic diagram showing the characteristics of a TFT employing a polycrystalline film prepared by the aforementioned method. Referring to FIG. 4, the axis of abscissas shows a gate voltage which is applied to a gate electrode, and the axis of ordinates shows a drain current. The broken line shows the characteristics of a TFT fabricated by the conventional method, and the solid line shows those of the TFT fabricated by the aforementioned method. Comparing these characteristics with each other, the inventive TFT has a high ON current and a low OFF current. Thus, it is understood that the inventive TFT exhibits excellent characteristics having a small leakage current in an OFF state and a high driving current in an ON state as compared with those of the conventional TFT.

Figure 5:
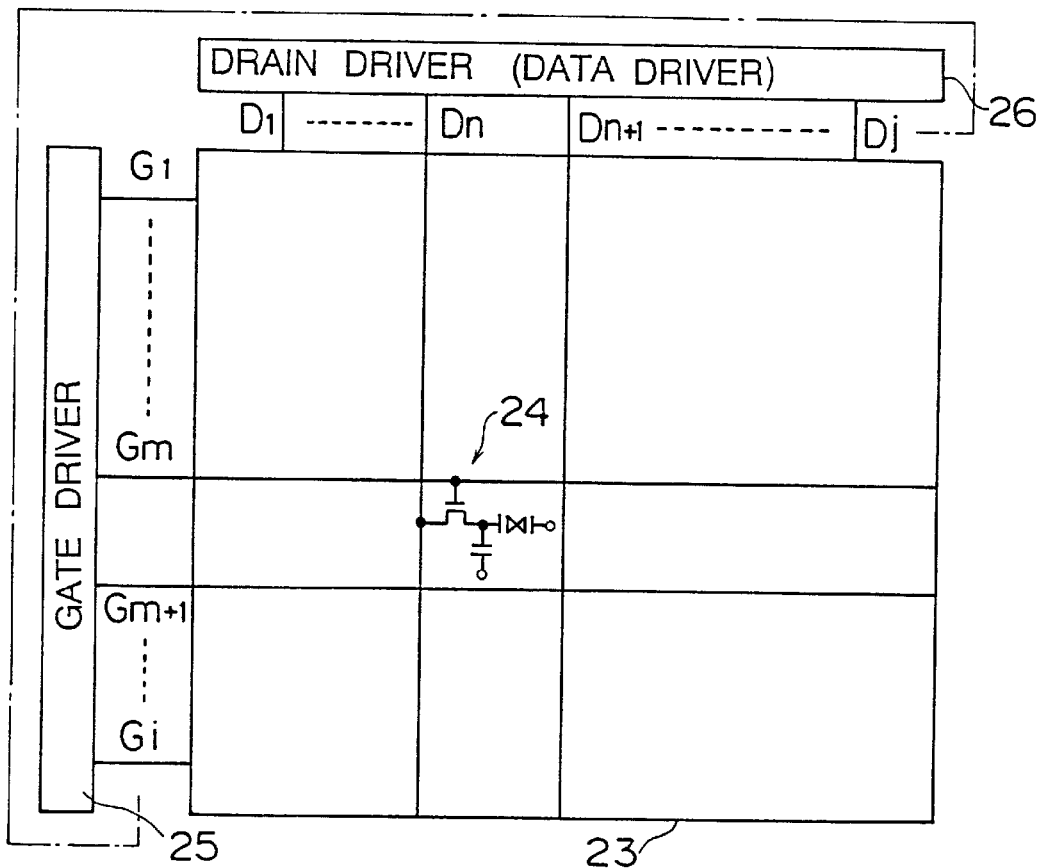
FIG. 5 is a block diagram showing the plane structure of a liquid crystal display to which the thin film transistor according to the first embodiment of the present invention is applied.

A polycrystalline silicon TFT which is fabricated by the aforementioned method is suitably employed as a pixel driving element for a pixel part of a transmission type LCD, for example. Therefore, the structure of a pixel part of a transmission LCD is now described. FIG. 5 is a block diagram showing the structure of an active matrix LCD. The LCD comprises a pixel part 23, a drain driver 26, and a gate driver 25. Gate wires G1 . . . Gm, Gm+1 . . . Gi and drain wires D1 . . . Dn, Dn+1 . . . Dj are arranged on the pixel part 23. The gate wires and the drain wires intersect with each other, so that pixels 24 are provided on the intersections therebetween respectively. The gate wires are connected to the gate driver 25 so that a gate signal is applied thereto from the gate driver 25, while the drain wires are connected to the drain driver 26 so that a data signal is applied thereto from the drain driver 26. A peripheral driving circuit is formed by the drain driver 26 and the gate driver 25. At least one of the drain driver 26 and the gate driver 25 is formed on the same substrate as the pixel part 23. An LCD having such a structure is called a driver-integrated LCD.

Figure 6:
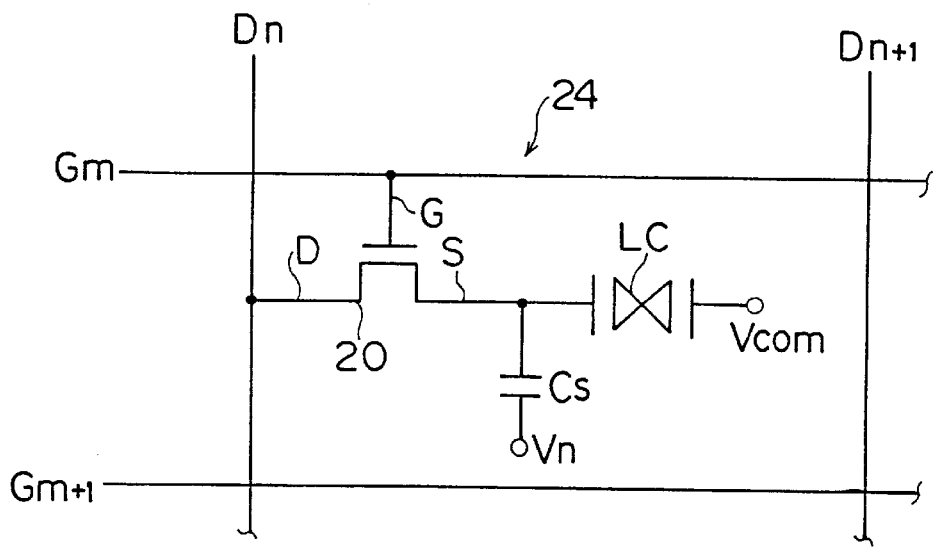
FIG. 6 is an equivalent circuit diagram of a pixel region shown in FIG. 5.
Figure 7:
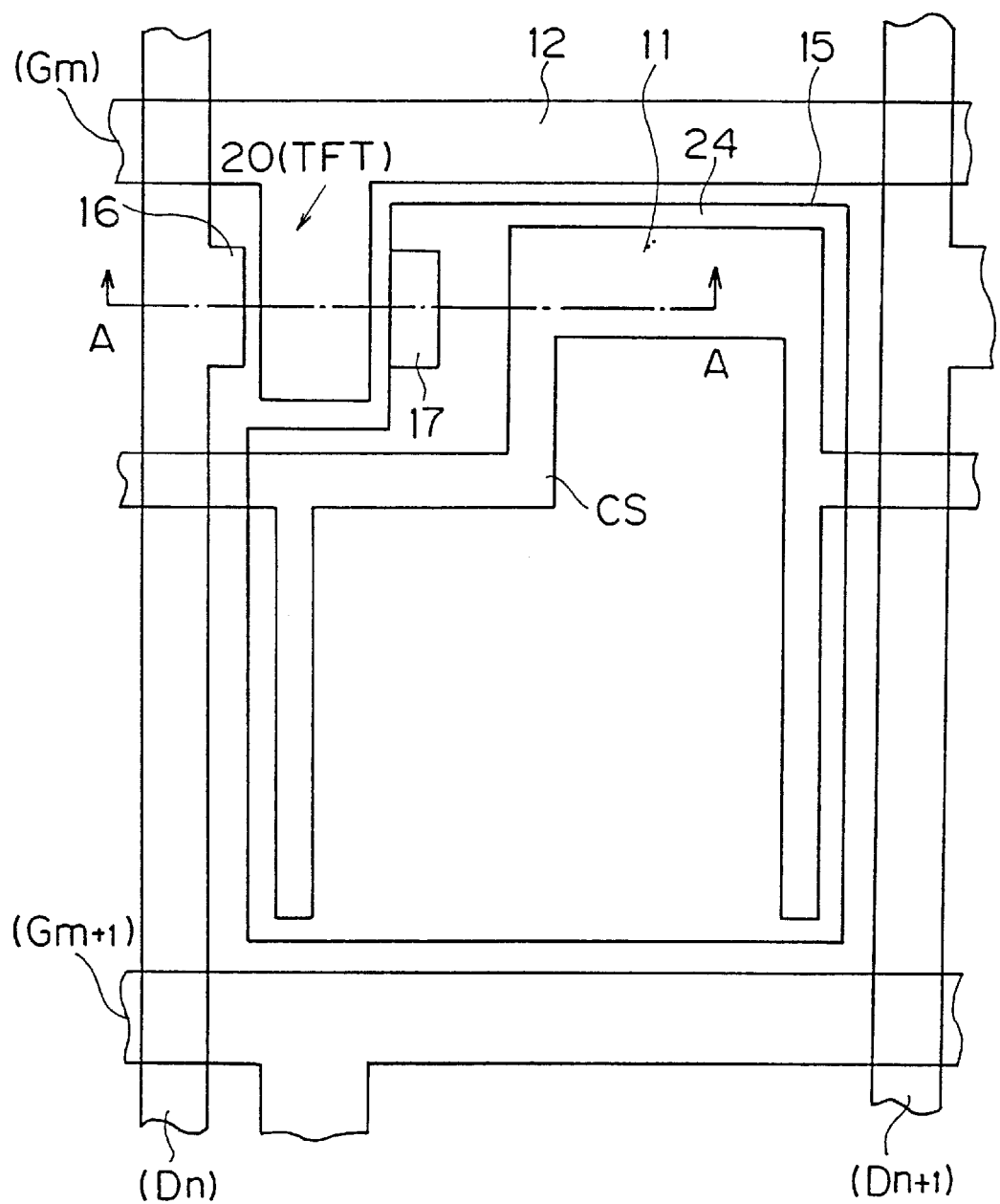
FIG. 7 illustrates the plane structure of the pixel region shown in FIGS. 5 and 6.
Figure 8:
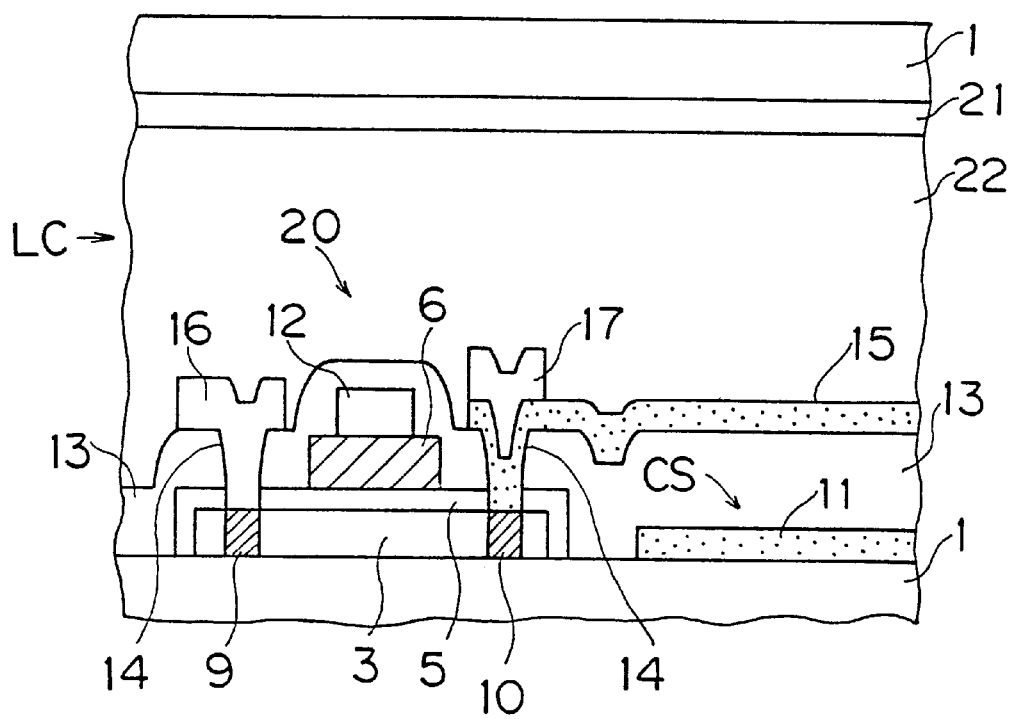
FIG. 8 is a sectional view taken along the line A—A in FIG. 7.

FIG. 6 is an equivalent circuit diagram of each pixel 24 provided on each intersection between each gate wire and each drain wire. FIG. 7 is a concrete plan sectional view of a portion around the pixel part, and FIG. 8 is a sectional view taken along the line A—A in FIG. 7. As shown in FIGS. 6 to 8, the pixel 24 is formed by a TFT 20 serving as a pixel driving element, a liquid crystal cell LC and an auxiliary capacitance CS. The TFT 20 has a gate G which is connected with a gate wire Gm, and a drain D which is connected with a drain wire Dn. The TFT 20 further has a source S which is connected with a display electrode and a storage capacitive electrode of the liquid crystal cell LC. A signal storage element is formed by the liquid crystal cell LC and the auxiliary capacitance CS.

When the gate wire Gm is set at a positive voltage so that the positive voltage is applied to the gate G of the TFT 20 in the pixel 24 having the aforementioned structure, the TFT 20 enters an ON state. Thus, an electrostatic capacitance of the liquid crystal cell LC and the auxiliary capacitance CS are charged by a data signal which is applied to the drain wire Dn. When a negative voltage is applied to the gate wire Gm, on the other hand, the TFT 20 enters an OFF state and a voltage being currently applied to the drain wire Dn is held by the electrostatic capacitance of the liquid crystal cell LC and the auxiliary capacitance CS. Thus, an arbitrary data signal can be held in the pixel 24 by supplying the data signal to be written therein to the drain wire Dn and controlling the applied voltage of the gate wire Gn. The transmittance of the liquid crystal cell LC is varied with the data signal held in the pixel 24, so that an image is displayed.

In the LCD, as hereinabove described, a pixel region and a peripheral driving circuit employing polycrystalline TFTs are formed on a substrate of glass or quartz. In such an LCD, a high temperature fabrication process or a low temperature fabrication process is employed in response to heat resistance of the material for the substrate. In case of the low temperature fabrication process, the substrate is formed by a glass substrate etc. having low heat resistance. When a high temperature treatment step is carried out in the fabrication process, therefore, the substrate of glass or the like is thermally deformed or warped. Therefore, the process of forming the polycrystalline TFT on the substrate must be performed under a low temperature of 500 to 650° C., for example. Therefore, a polycrystalline silicon film which is formed under an atmosphere containing oxygen element by solid-phase epitaxy at a low temperature according to the present invention is suitable for an LCD to which such a low temperature process is required in particular.

Second Embodiment

Figure 9:
FIGS. 9(a) to 9(d) illustrate principal steps of fabricating a thin film transistor according to a second embodiment of the present invention.
Figure 9:
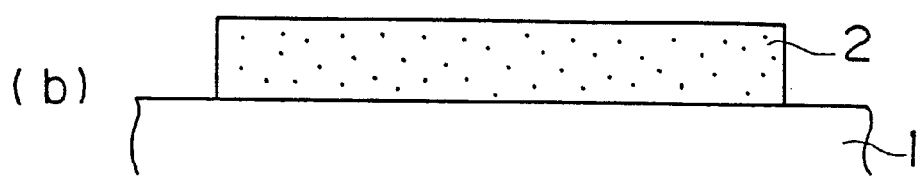
Figure 9:
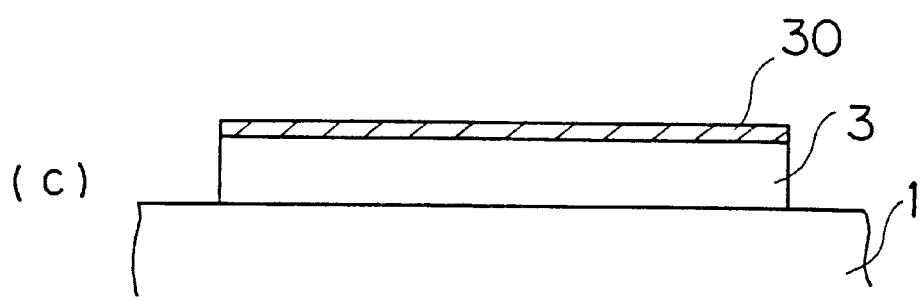
Figure 9:
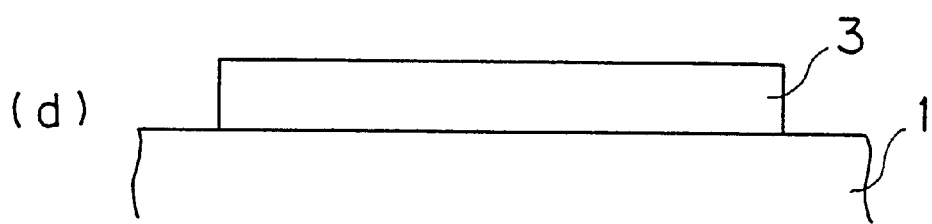

FIGS. 9(*a*) to 9(*d*) are explanatory diagrams showing steps of fabricating a thin film transistor of a second embodiment according to the second aspect of the present invention. The second embodiment is different from the first embodiment in a solid-phase epitaxy process of crystallizing an amorphous silicon film into a polycrystalline silicon film. Therefore, the steps shown in FIGS. 9(*a*) to 9(*d*) are substitutional for the fabrication process shown in FIGS. 1(*a*) to 1(*c*) in relation to the first embodiment.

The steps of forming a polycrystalline silicon film on a substrate are now described.

First, a semiconductor or insulating substrate 1 is prepared as shown in FIG. 9(*a*). The semiconductor substrate is formed by a silicon substrate or a gallium arsenide substrate. On the other hand, the insulating substrate includes a substrate consisting of any insulating material such as glass, quartz, heat-resistant glass, heat-resistant resin or ceramics. Further, a conductive substrate of a metal or the like which is provided with an insulating film such as a silicon film on its surface, or a semiconductive substrate which is provided with an insulating film such as a silicon oxide film on its surface is also applicable.

Then, an amorphous silicon film 2 is formed on the substrate 1 by LP-CVD, as shown in FIG. 9(*b*). The conditions shown in Table 1 are set as the film forming conditions similarly to the first embodiment, for example.

Alternatively, the amorphous silicon film 2 can be formed by plasma CVD. In this case, film forming conditions are set as follows, for example:

Substrate Temperature: 500 to 600° C.

Gas Flow Rate: 50 sccm for $SiH_4$ and 40 sccm for $H_2$

RF power: 40 W

Further, a heat treatment is performed to epitaxially grow the amorphous silicon film 2 in a solid phase, for obtaining a polycrystalline silicon film 3, as shown in FIG. 9(*c*).

Figure 10:
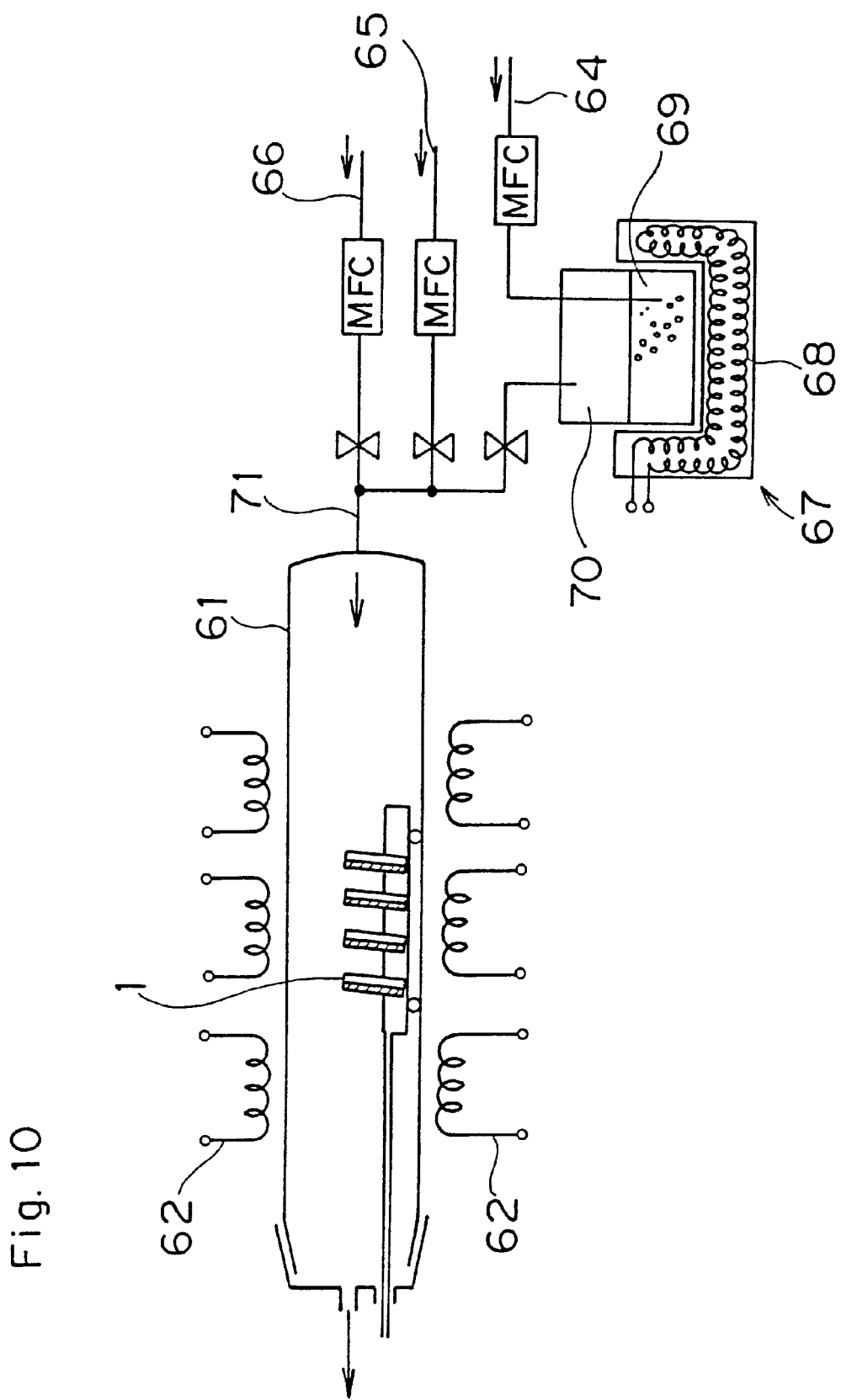
FIG. 10 illustrates the structural principle of a heat treatment apparatus employed in a heat treatment step included in FIGS. 9(a) to 9(d)

FIG. 10 is a block diagram showing the structure of an apparatus which is employed for this heat treatment in principle. The substrate 1 which is provided with the amorphous silicon film 2 is introduced into a silica tube 61. Heaters 62 are provided around the silica tube 61, for heating and maintaining the substrate 1 to and at a prescribed temperature. An inlet tube 71 is connected to an end of the silica tube 61, for introducing prescribed gas etc. into the same. Further, a plurality of inlet tubes are further connected to the inlet tube 71. In the example shown in FIG. 10, an oxygen inlet tube 65 for introducing oxygen, a wet oxygen inlet tube 64 for introducing wet oxygen, and a nitrogen gas inlet tube 66 for introducing nitrogen gas are connected to the inlet tube 71. The nitrogen gas inlet tube 66 is not particularly necessary in the present invention, but is employed for a comparison test as described later. Further, a wet oxygen generator 67 is provided on an intermediate portion of the wet oxygen inlet tube 64. In this wet oxygen generator 67, a heater 68 is provided around a vessel holding pure water 69. Oxygen gas which is supplied from the wet oxygen inlet tube 64 is discharged into the pure water and heated by the heater 68, so that oversaturated water vapor which is present in an upper portion of the vessel is mixed with discharged oxygen to form wet oxygen 70. The wet oxygen 70 is introduced into the silica tube 61 through the inlet tube 71.

The heat treatment step which is carried out through the aforementioned apparatus is set under the following conditions:

First, wet oxygen is introduced into the silica tube 61 as solid-phase epitaxy atmosphere gas. This wet oxygen is preferably in an oversaturated state. If the content of water vapor is about several ppm to several %, however, the rate of formation of an oxide film on the surface of the amorphous silicon film 2 is retarded. Therefore, the oversaturated state is properly decided in consideration of efficiency in fabrication etc.

The substrate temperature is selected in a temperature range exceeding a temperature which is necessary for epitaxially growing the amorphous silicon film 2 in a solid phase while causing no thermal distortion of the substrate etc. For example, the substrate temperature is set the range of 500 to 600° C. The heat treatment time, which is varied with the substrate temperature, is set at a time capable of sufficiently growing grains of the polycrystalline silicon film which is epitaxially grown in a solid phase, in the range of about 10 to 20 hours, for example.

When the heat treatment is performed under the aforementioned conditions, solid-phase epitaxy of the amorphous silicon film 2 is started so that growth of crystal grains is started, as shown in FIG. 9(*c*). At this time, formation of an oxide film 30 is started on the surface of the amorphous silicon film 2 which is exposed to the wet oxygen atmosphere. A silicon oxide film which is richer in Si than a stoichiometric ratio is formed as the oxide film, whereby oxygen which has been contained in the amorphous silicon film 2 are attracted toward the surface side and incorporated in the oxide film 30. Consequently, the oxygen concentration in the crystallized silicon film is reduced. Due to this phenomenon, a polycrystalline silicon film 3 having extremely small oxygen concentration can be obtained.

The solid-phase epitaxy can be performed not only under the wet oxygen atmosphere but under a water vapor atmosphere containing gas containing oxygen element of $CO_x$, $O_3$ or $N_xO$, or inert gas such as nitrogen, argon or xenon.

Thereafter a heat treatment is performed, in order to reduce crystal defects in the polycrystalline silicon film 3. The head treatment conditions depend on whether a high temperature process or a low temperature process is applied to fabrication of the polycrystalline silicon thin film transistor. When the substrate 1 is prepared from heat resistant glass or quartz with application of a high temperature process, for example, the heat treatment is performed in an $N_2$ atmosphere at a temperature of 1050° C. for 0.5 hours. When the substrate 1 is prepared from ordinary glass or the like with application of a low temperature process, on the other hand, the heat treatment is performed in an $N_2$ atmosphere at a temperature of 500 to 650° C. for 10 hours. Due to this treatment, crystal defects caused in the polycrystalline silicon film 3 which is formed by solid-phase epitaxy can be removed to attain high quality. When the heat treatment is performed at a high temperature of 1050° C. in the high temperature process, oxygen is additionally incorporated in the oxide film 30 from the crystallized film following the solid-phase epitaxy step, whereby the oxygen concentration in the polycrystalline silicon film 3 can be further reduced.

Further, the oxide film 30 which is formed on the surface of the polycrystalline silicon film 3 through the aforementioned heat treatment step is removed by wet etching with hydrofluoric acid or the like, as shown in FIG. 9(d). Thus, the polycrystalline silicon film 3 which is formed on the substrate 1 can be extremely reduced in concentration of oxygen serving as an impurity. This polycrystalline silicon film 3 is employed as an active layer of the TFT which is fabricated through the steps shown in FIGS. 2(d) to 2(i).

In relation to the fabrication process for a thin film transistor according to the second embodiment, two experiments were carried out as follows:

First Experimental Example

First, an amorphous silicon film was formed on a substrate by LP-CVD, under the film forming conditions shown in Table 1.

Then, the amorphous silicon film was epitaxially grown in a solid phase under heat treatment conditions shown in Table 2.

TABLE 2

| Item | Condition | |
|---|---|---|
| Temperature | 600° C. | |
| Time | 20 hours | |
| Atmosphere | Oxygen | 4 l/min. |
| | Wet Oxygen | 0.3 l/min. |
| Pressure | 760 Torr | |

The heat treatment was performed through the apparatus shown in FIG. 10. Oxygen was mixed with wet oxygen which was prepared by the wet oxygen generator in the flow rates shown in Table 2, and introduced into the silica tube 61.

Figure 11:
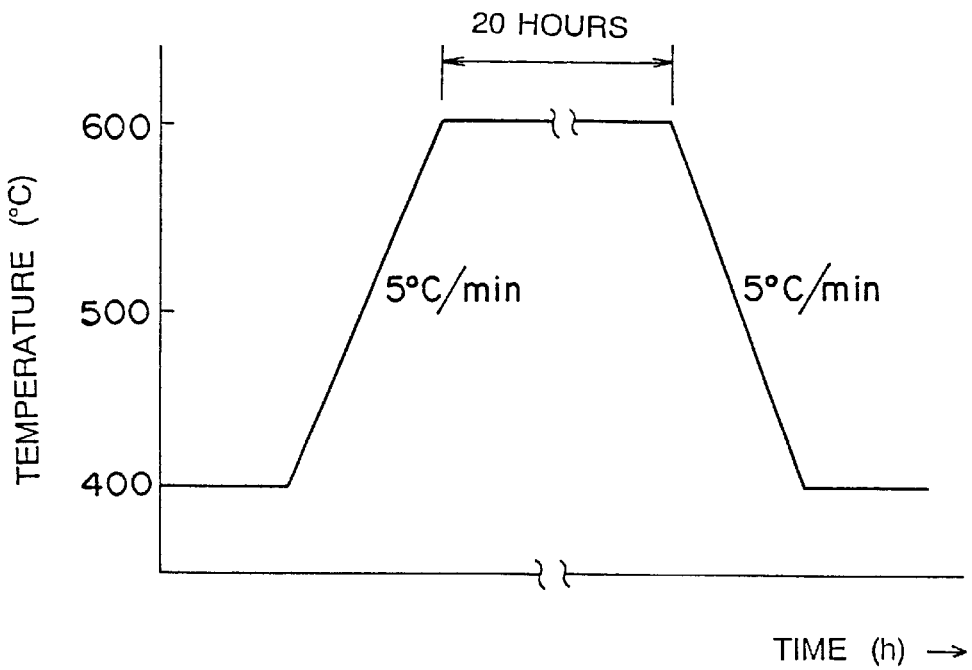
FIG. 11 illustrates a temperature profile of a treatment applied to Experimental Example of the thin film transistor according to the second embodiment of the present invention.

FIG. 11 illustrates a temperature profile of the heat treatment. As shown in FIG. 11, the interior of the silica tube 61 was heated and kept in the heated state when the substrate temperature reached 600° C., to make solid-phase epitaxy for 20 hours. Thereafter a heat treatment was performed in an $N_2$ atmosphere at a temperature of 600° C. for 50 hours. Consequently, a silicon oxide film of about 300 Å was formed on the surface of a crystallized polycrystalline silicon film. This silicon oxide film was removed by wet etching with hydrofluoric acid. As to the polycrystalline silicon film obtained in this manner, oxygen concentration and crystal defects in the film were investigated. For the purpose of comparison, a conventional polycrystalline silicon film which was obtained by solid-phase epitaxy under an $N_2$ atmosphere was also subjected to similar investigation. Tables 3 and 4 show results in relation to raw material gas of silane and disilane respectively.

TABLE 3

Raw Material Gas: $SiH_4$

| | Solid-Phase Epitaxy Atmosphere | |
|---|---|---|
| | $N_2$ (Prior Art) | Wet $O_2$ (First Experimental Example) |
| Number of Crystal Defects[*1] (spin/cm$^2$) | $4.0 \times 10^{13}$ | $2.3 \times 10^{13}$ |
| Oxygen Concentration[*2] (cm$^{-3}$) | $1.0 \times 10^{19}$ | $<7.0 \times 10^{18}$ |

[*1]obtained by ESR
[*2]obtained by SIMS

TABLE 4

Raw Material Gas: $Si_2H_6$

| | Solid-Phase Epitaxy Atmosphere | |
|---|---|---|
| | $N_2$ (Prior Art) | Wet $O_2$ (First Experimental Example) |
| Number of Crystal Defects[*1] (spin/cm$^2$) | $4.0 \times 10^{13}$ | $3.0 \times 10^{13}$ |
| Oxygen Concentration[*2] (cm$^{-3}$) | $1.0 \times 10^{19}$ | $<0.9 \times 10^{18}$ |

[*1]obtained by ESR
[*2]obtained by SIMS

It has been proved that the oxygen concentration was below the limit of detection of a detector by SIMS in relation to each of silane and disilane, and the number of crystal defects in the film was remarkably reduced in response thereto.

Figure 12:
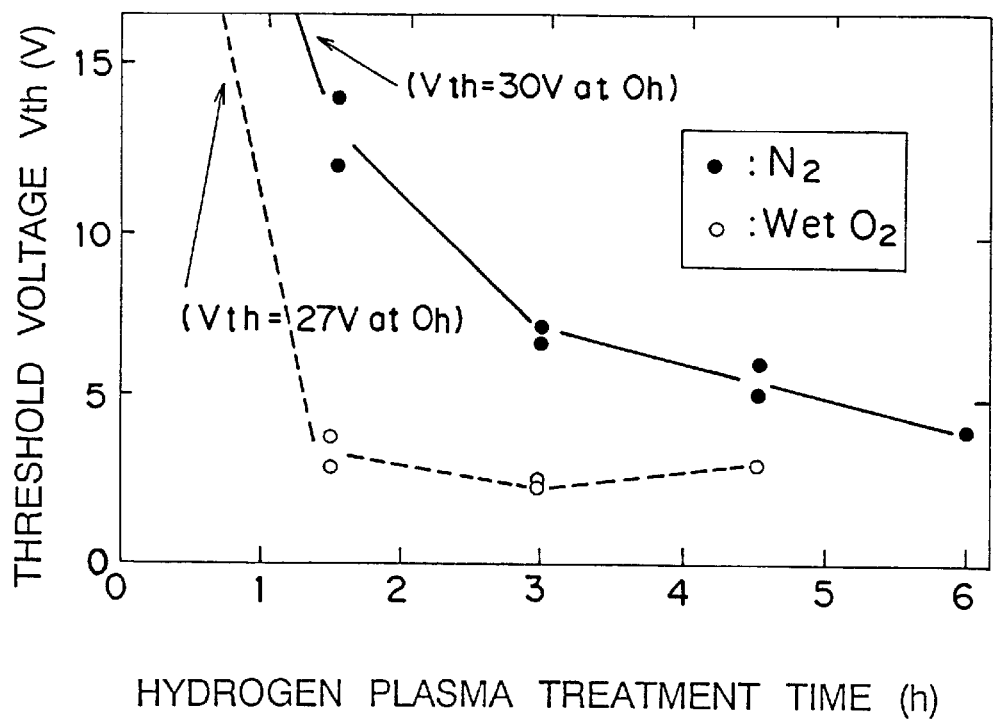
FIG. 12 is a threshold voltage characteristic diagram of a thin film transistor fabricated by the second embodiment.

Further, TFTs were prepared from the polycrystalline silicon films which were obtained in the aforementioned manners, and subjected to investigation of the characteristics. FIG. 12 is a characteristic diagram showing relations between threshold voltages of the TFTs according to the conventional method and the above Experimental Example and hydrogen plasma treatment times. As understood from FIG. 12, the threshold voltage was reduced to a desired value by a short-time hydrogen plasma treatment in the TFT according to Experimental Example, while it took a long time for the hydrogen plasma treatment in the conventional TFT and its threshold value was higher than that of Experimental Example. This is because the number of the crystal defects was reduced in the polycrystalline silicon film according to Experimental Example which was applied to an active layer. Table 5 shows such improvement in characteristics of the TFT with other parameters.

TABLE 5

|  | Prior Art (N$_2$) | Second Embodiment (Wet O$_2$) |
| --- | --- | --- |
| Mobility (cm$^2$/V.s) | 8.0 | 35 |
| Vth (V) | about 7.0 | 2.0 |
| S Value (V/dec.) | 1.6 | 0.27 |

It is understood from Table 5 that the carrier mobility was improved, the threshold voltage was reduced and a sub-threshold swing value (S value) was reduced after a hydrogen plasma treatment of 3 hours in the TFT according to Experimental Example. Thus, a TFT having a high response speed which was drivable at a low voltage was obtained.

Second Experimental Example

This Experimental Example is different from first Experimental Example in a point that a high-temperature heat treatment was performed in an N$_2$ atmosphere after solid-phase epitaxy.

First, an amorphous silicon film was formed on a quartz glass substrate by LP-CVD under film forming conditions shown in Table 6.

TABLE 6

| Raw Material Gas | Si$_2$H$_6$ |
| --- | --- |
| Pressure | 0.6 Torr |
| Substrate Temperature | 480° C. |
| Gas Flow Rate | 80 cc/min. |
| Film Forming Rate | 30 Å/min. |

Then, an amorphous silicon film was epitaxially grown in a solid phase under the heat treatment conditions shown in Table 2, with employment of the apparatus shown in FIG. 10. Oxygen and wet oxygen which was prepared by the wet oxygen generator were mixed with each other in the flow rates shown in Table 2, and introduced into the silica tube 61.

Further, the interior of the silica tube 61 was heated along the temperature profile shown in FIG. 11, and kept in the heated state when the substrate temperature reached 600° C., to make solid-phase epitaxy for 20 hours. Thereafter a heat treatment was performed in an N$_2$ atmosphere at a temperature of 1050° C. for 0.5 hours. Consequently, a silicon oxide film of about 300 Å was formed on a crystallized polycrystalline silicon film. This silicon oxide film was removed by wet etching with hydrofluoric acid.

For the purpose of comparison, a polycrystalline silicon film was formed by the following conventional method: An amorphous silicon film was formed on a quartz glass substrate and thereafter epitaxially grown in a solid phase in an N$_2$ atmosphere at a temperature of 600° C. for 20 hours, to form a polycrystalline silicon film. Further, a heat treatment was performed in an oxygen atmosphere at a temperature of 1000° C. for 0.5 hours, and thereafter an oxide film which was formed on the surface was removed, to obtain the polycrystalline silicon film.

As to the polycrystalline silicon film which was obtained in the aforementioned manner, oxygen concentration and crystal defects in the film were investigated. Table 7 shows the results.

TABLE 7

| | Solid-Phase Epitaxy Atmosphere | |
| --- | --- | --- |
| | N$_2$ (prior Art) | Wet O$_2$ (Second Experimental Example) |
| Crystal Defect Density[*1] (cm$^{-3}$) | 7.8 × 10$^{18}$ | <5 × 10$^{17}$ |
| Oxygen Concentration[*2] (cm$^{-3}$) | 2.0 × 10$^{18}$ | <9.0 × 10$^{17}$ |

[*1]obtained by ESR
[*2]obtained by SIMS

As clearly understood from Table 7, it has been proved that the oxygen concentration of the inventive polycrystalline silicon film was below the limit of detection of a detector by SIMS and the number of crystal defects in the film was remarkably reduced as compared with the conventional example.

Further, TFTs were fabricated by the polycrystalline silicon films obtained in the aforementioned manner, and subjected to investigation of the characteristics. Table 8 shows the results. The TFTs were 5 μm in gate width W and 5 μm in gate length L, with single gate structures.

TABLE 8

| | Prior Art (N$_2$) | Second Experimental Example (Wet O$_2$) |
| --- | --- | --- |
| Mobility (cm$^2$/V.s) | 160 | 180 |
| Vth (V) | 1 to 2 | 0.5 to 1.0 |
| S Value (V/dec.) | 0.2 | 0.15 |

It is understood from Table 8 that the carrier mobility was improved, the threshold voltage was reduced and the sub-threshold swing value (S value) was reduced in the inventive TFT. Thus, a TFT having a high response speed which was drivable at a low voltage was obtained.

Third Embodiment

A third embodiment according to the second aspect of the present invention is now described.

While the removal of oxygen which is an impurity in the film and the solid-phase epitaxy of the amorphous silicon film are simultaneously carried out by a single heat treatment in the aforementioned method according to the second embodiment, these steps may alternatively be carried out independently of each other. FIGS. 13(a) to 13(d) are explanatory diagrams showing steps of fabricating a polycrystalline silicon film by such a method.

The steps shown in FIGS. 13(a) and 13(b) are similar to those of the second embodiment described with reference to FIGS. 9(a) and 9(b), and hence redundant description is omitted.

Following these steps, a heat treatment is performed at a low temperature causing no crystallization of an amorphous silicon film 2 to be capable of removing oxygen from the film in this embodiment, as shown in FIG. 13(c). In this case, heat treatment conditions are set as follows:

First, wet oxygen is employed as the atmosphere gas, similarly to the second embodiment. The heat treatment can also be performed in a wet atmosphere containing water vapor and O$_x$, O$_3$ or N$_x$O. A substrate temperature is set at a low temperature level causing no solid-phase epitaxy of the amorphous silicon film 2 in a temperature range capable of forming an oxide film 31 on its surface. For example, this temperature is set in the range of 500 to 580° C. The heat treatment time is set at about 10 to 20 hours.

When the heat treatment is performed under such conditions, oxygen contained in the amorphous silicon film 2 is incorporated in the oxide film 31 in the process of formation of the oxide film 31 on the surface of the amorphous silicon film 2 similarly to the second embodiment, whereby the oxygen concentration in the amorphous silicon film 2 is reduced.

Figure 13:
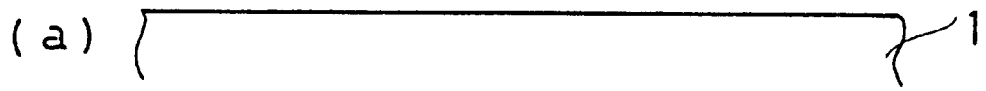
FIGS. 13(a) to 13(d) illustrate principal steps of fabricating a thin film transistor according to a third embodiment of the present invention.
Figure 13:
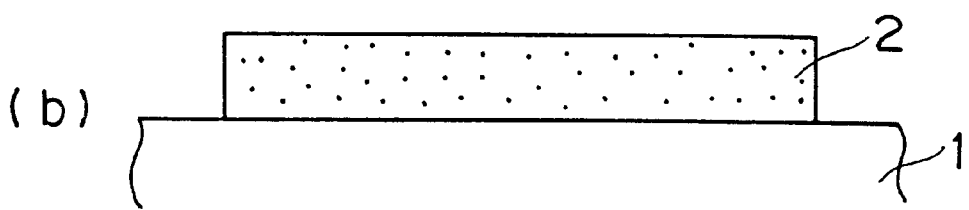
Figure 13:
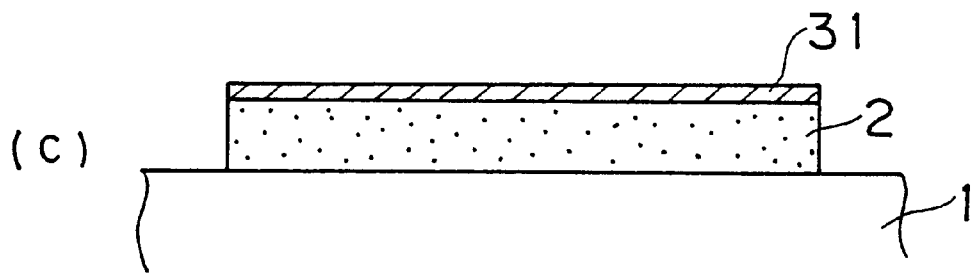
Figure 13:
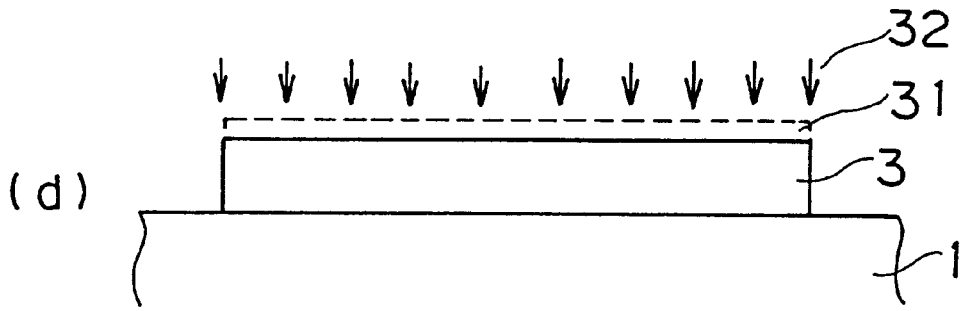

Further, the amorphous silicon film 2 is crystallized into a polycrystalline silicon film 3 by general solid-phase epitaxy, as shown in FIG. 13(*d*). Thereafter the oxide film 31 which is formed on its surface is removed by wet etching or the like. Thus, the polycrystalline silicon film 3 can be extremely reduced in oxygen concentration. In this step, the amorphous silicon film 2 may alternatively be epitaxially grown in a solid phase after the oxide film 31 is previously removed. Further, the polycrystalline silicon film 3 can be obtained from the amorphous silicon film 2 by melt recrystallization. This melt recrystallization is adapted to melt and recrystallize only the surface of the amorphous silicon film 2 while maintaining the substrate temperature below 600° C., and includes laser annealing and RTA (rapid thermal annealing). The laser annealing is adapted to irradiate the surface of the amorphous silicon film 2 with a laser beam for heating/melting the same. The RTA is adapted to irradiate the surface of the amorphous silicon film 2 with a lamp beam for heating/melting the same. The polycrystalline silicon film 3 which is prepared by such a method is employed as an active layer for a TFT which is fabricated by the subsequently performed steps shown in FIGS. 1(*d*) to 2(*i*).

Figure 14:
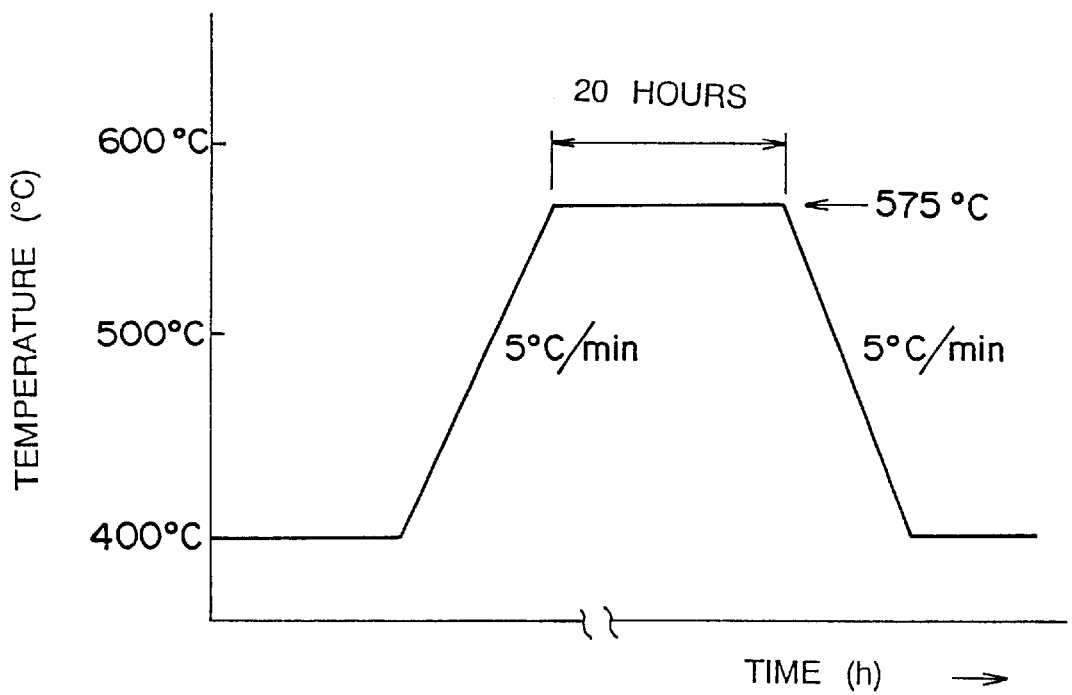
FIG. 14 illustrates a temperature profile of a heat treatment applied to fabrication of the thin film transistor according to the third embodiment of the present invention.

Also in relation to the third embodiment, an experiment of measuring impurity concentration after a heat treatment was performed, similarly to the second embodiment. FIG. 14 illustrates a temperature profile in the heat treatment of the amorphous silicon film in this experiment. In this experiment, the substrate temperature was maintained at 575° C. for 20 hours. At this temperature, no crystallization of amorphous silicon was caused while the surface of the amorphous silicon film was oxidized under a wet oxygen atmosphere, to form an oxide film. For the purpose of comparison, a heat treatment under a nitrogen atmosphere was performed similarly to the prior art. Table 9 shows results of analyzing concentration of impurities in amorphous silicon films after heat treatments through SIMS analysis.

TABLE 9

| Impurity (cm$^{-3}$) | Prior Art (N$_2$) | Third Embodiment (Wet O$_2$) | Before Heat Treatment |
|---|---|---|---|
| Carbon | 5 × 10$^{17}$ | 5 × 10$^{17}$ | 5 × 10$^{17}$ |
| Oxygen | 1 × 10$^{19}$ | <1 × 10$^{18}$ | 1 × 10$^{19}$ |
| Nitrogen | 1 × 10$^{17}$ | 1 × 10$^{17}$ | 1 × 10$^{17}$ |

It is clearly understood from Table 9 that the oxygen concentration was remarkably reduced below the limit of detection after the heat treatment in the inventive Experimental Example. A polycrystalline silicon film which is obtained by polycrystallizing such an amorphous silicon film having extremely low oxygen concentration also has low oxygen concentration, whereby an excellent polycrystalline silicon film having a small number of crystal defects can be obtained.

Fourth Embodiment

A fourth embodiment according to the second aspect of the present invention is now described.

Figure 15:
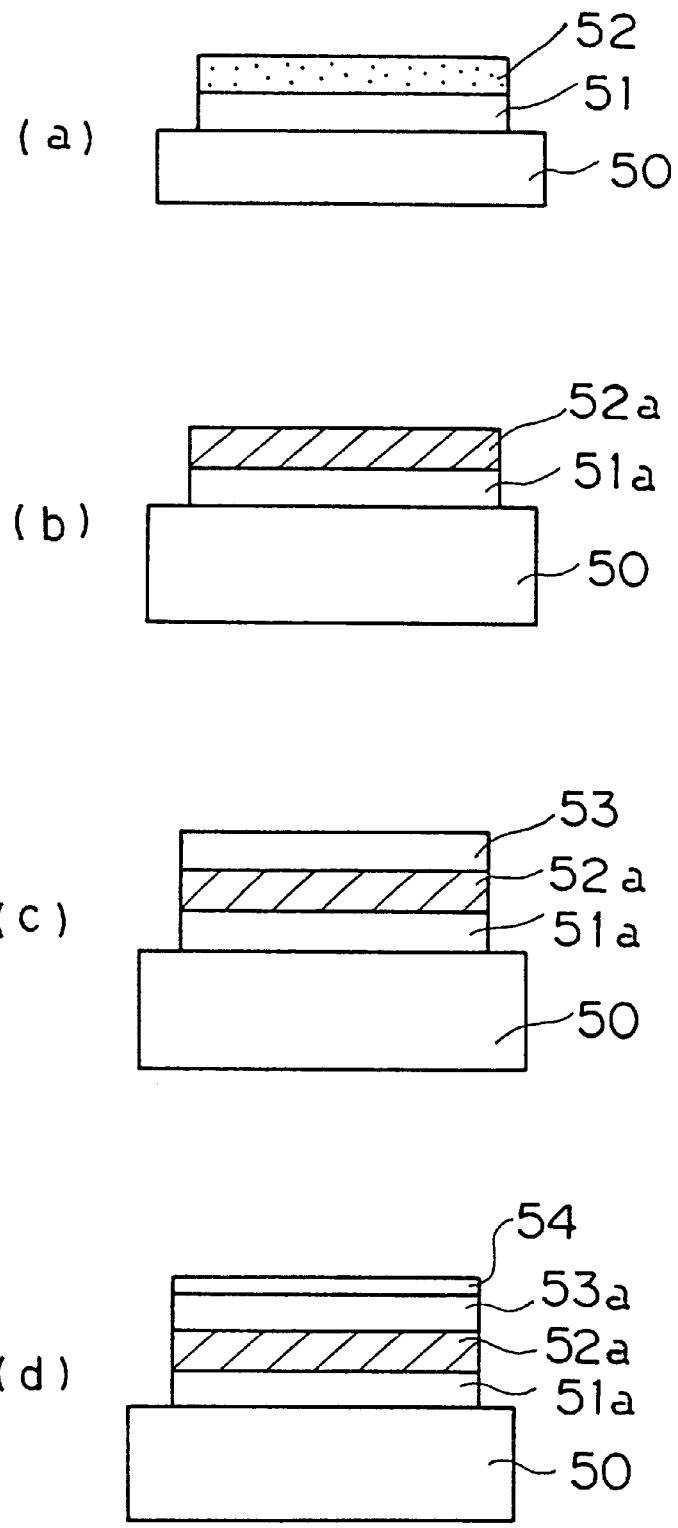
FIGS. 15(a) to 15(d) illustrate steps of fabricating a solar cell according to a fourth embodiment of the present invention.

FIGS. 15(*a*) to 15(*d*) are sectional views showing steps of fabricating a solar cell (photovoltaic device) according to the fourth embodiment of the present invention. The fabrication process for a polycrystalline silicon film according to the second aspect of the present invention is also applicable to a polycrystalline silicon electrode for a solar cell, as hereafter described. The steps of fabricating a solar cell are now described with reference to FIGS. 15(*a*) to 15(*d*).

First, an n-type amorphous silicon film 51 which is doped with phosphorus (P) and a non-doped amorphous silicon film 52 are continuously formed on a surface of a substrate 50 consisting of a high melting point metal by plasma CVD or the like, as shown in FIG. 15(*a*).

Then, a heat treatment is performed in a wet oxygen atmosphere, to epitaxially grow the n-type amorphous silicon film 51 and the non-doped amorphous silicon film 52 in a solid phase, as shown in FIG. 15(*b*). This heat treatment step can be performed under conditions similar to those for the heat treatment in the second or third embodiment.

When the heat treatment is performed under conditions similar to those in the second embodiment, the n-type and non-doped amorphous silicon films 51 and 52 are epitaxially grown in a solid phase into polycrystalline silicon films 51*a* and 52*a* respectively. A thin oxide film is formed on the non-doped polycrystalline silicon film 52*a*. This oxide film is removed from the surface of the non-doped polycrystalline silicon film 52*a* by wet etching or the like.

When the heat treatment is performed under conditions similar to those in the third embodiment, on the other hand, oxygen contained in the amorphous silicon films 51 and 52 are incorporated in an oxide film which is formed on the surface of the non-doped amorphous silicon film 52 in the process of oxidation thereof, whereby oxygen concentration in the films is reduced. Subsequently or after removal of the oxide film, the amorphous silicon films 51 and 52 are crystallized into the polycrystalline silicon films 51*a* and 52*a* respectively through solid-phase epitaxy, melt recrystallization or the like.

Further, a p-type amorphous silicon film 53 which is doped with a p-type impurity such as boron (B) is formed by plasma CVD or the like, as shown in FIG. 15(*c*). Then, a heat treatment is performed in a wet oxygen atmosphere or an N$_2$ atmosphere, to form a polycrystalline silicon film 53*a*, as shown in FIG. 15(*d*).

Further, a transparent electrode 54 of ITO or the like is formed on the p-type polycrystalline silicon film 53*a*, as shown in FIG. 15(*d*). A prescribed wire is connected to complete a solar cell.

Also in the solar cell which is formed through the aforementioned steps, polycrystalline silicon films forming the respective layers of a pin structure, at least that forming an in layer, are reduced in oxygen concentration, whereby crystal defects in the films are reduced. Thus, a solar cell having excellent photoelectric conversion efficiency can be obtained.

Modifications of First, Second and Fourth Embodiments

Figure 16:
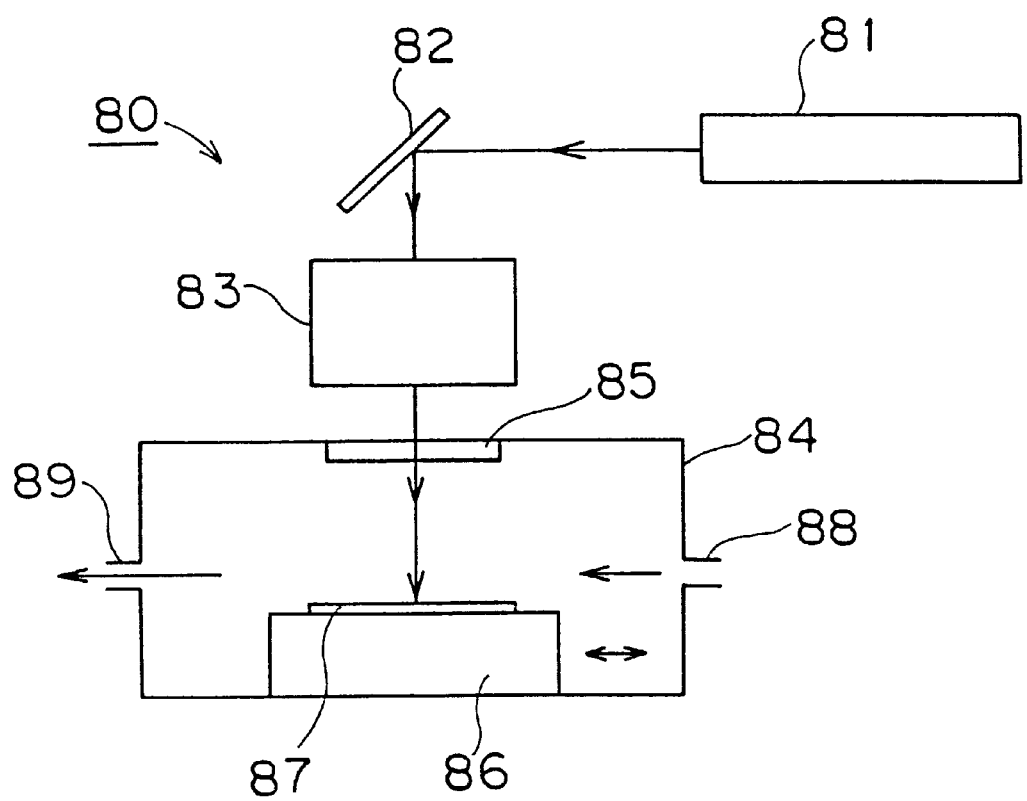
FIG. 16 is a schematic block diagram of a laser annealing device employed for melt recrystallization of an amorphous silicon film.
Figure 17:
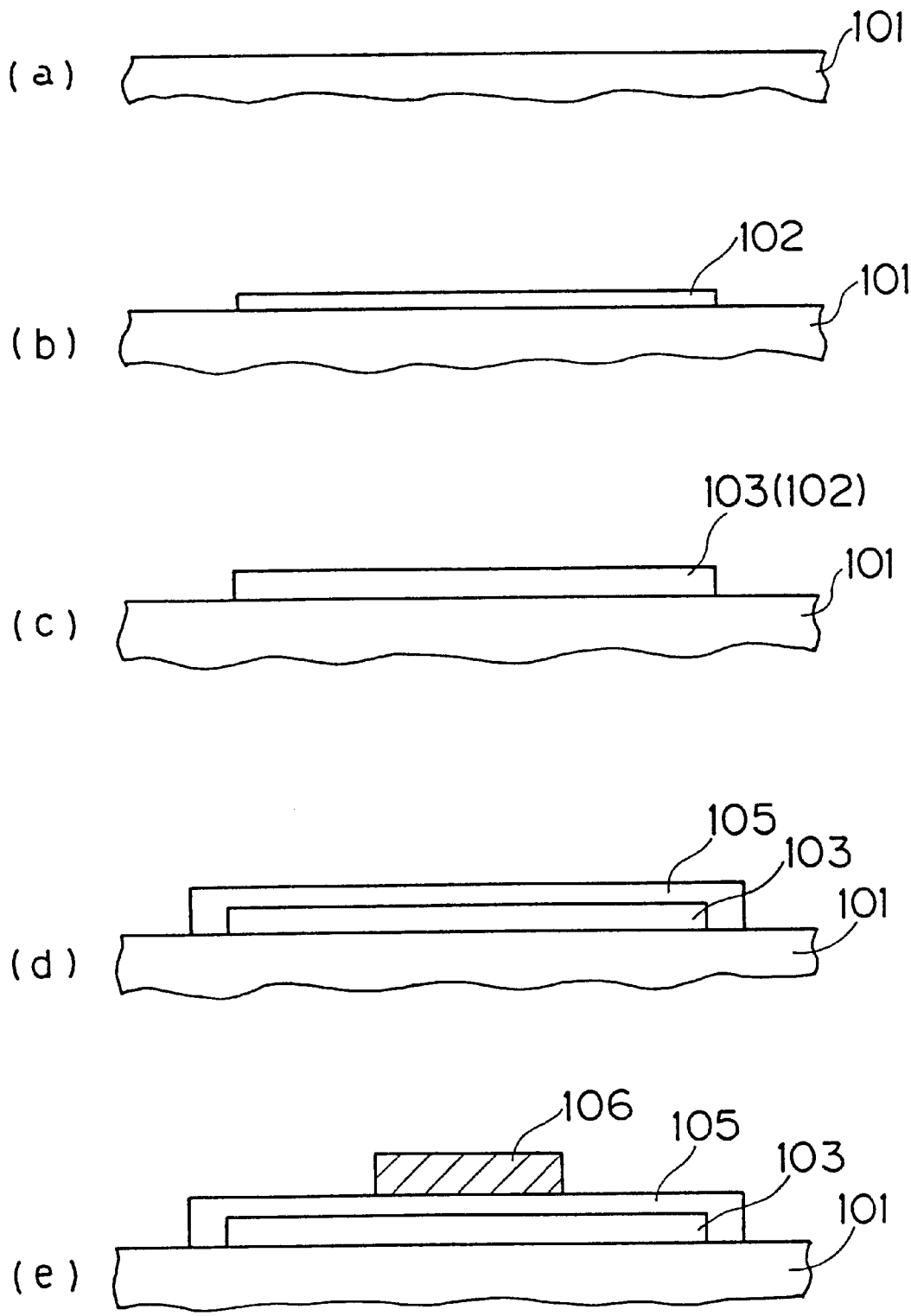
FIGS. 17(a) to 17(e) illustrate steps of fabricating a conventional thin film transistor.
Figure 18:
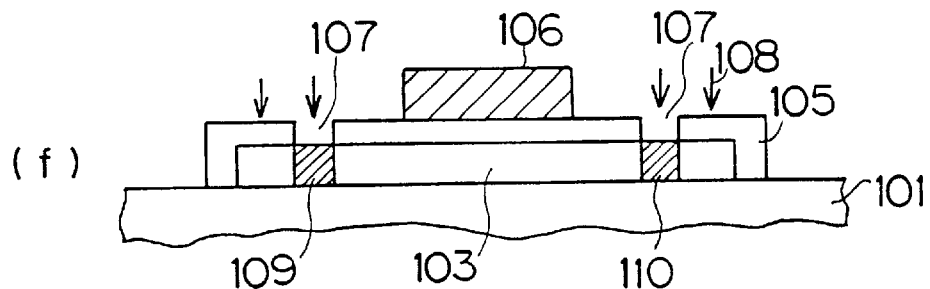
FIGS. 18(f) to 18(i) illustrate steps of fabricating the conventional thin film transistor following those shown in FIGS. 17(a) to 17(e)
Figure 18:
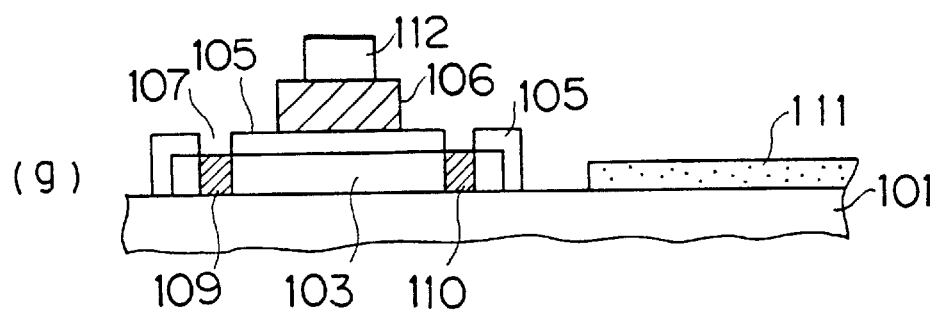
Figure 18:
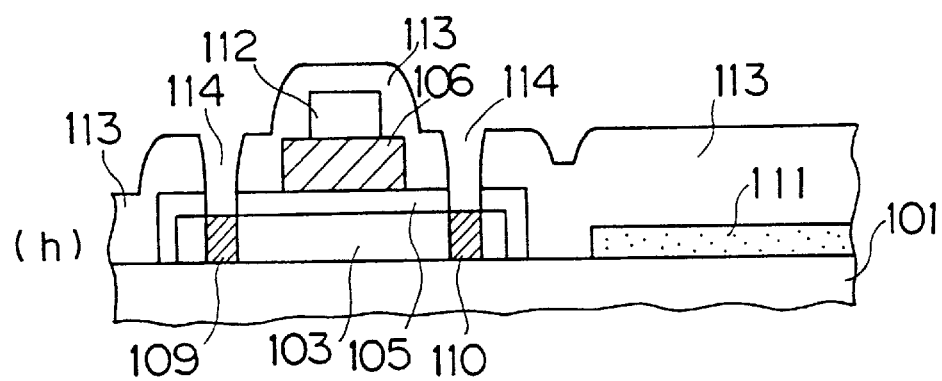
Figure 18:
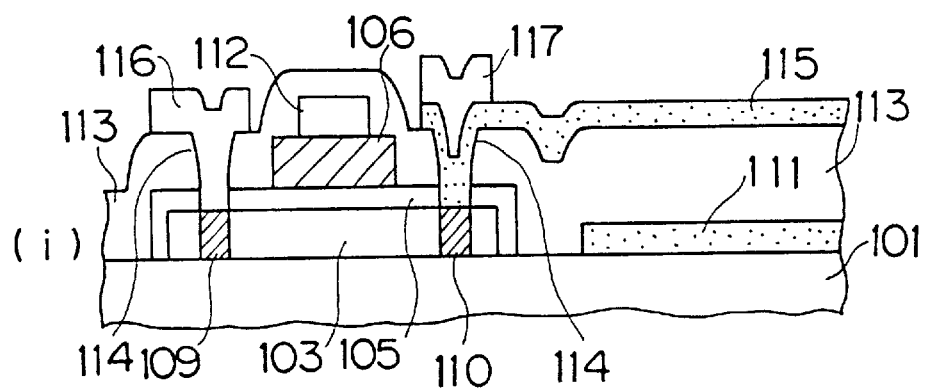

While the polycrystalline silicon film is formed by epitaxially growing the amorphous silicon film in a solid phase in a wet oxygen atmosphere in each of the steps shown in FIGS. 1(*c*), 9(*c*) and 15(*b*) in the first, second and fourth embodiments, melt recrystallization may alternatively be employed in place of the solid-phase epitaxy. Laser annealing or RTA is employed as the melt recrystallization. For example, FIG. 16 is a schematic block diagram showing a laser annealing device 80 which enables introduction of wet oxygen. The laser annealing device 80 is provided in a vessel 84 with a stage 86 for receiving and heating a substrate 87.

Further, the vessel 84 is provided with an inlet tube 88 for introducing wet oxygen into its interior and an outlet tube 89 for discharging internal gas. The surface of the substrate 87 is irradiated with a laser beam which is emitted from an excimer laser 81 thorough a mirror 82, a beam homogenizer 83 and a quartz window 85. Thus, an amorphous silicon film which is formed on the surface of the substrate 87 is melted and recrystallized. In this case, annealing conditions are set as follows, for example:

Light Source: XeF of ArF excimer laser
Energy Density: 100 to 300 mJ/cm$^2$
Substrate Temperature: <600° C.
Atmosphere: wet oxygen atmosphere (oversaturated state)
Flow Rate: 3 l/min.

After the melt recrystallization step, a heat treatment may be performed in an $N_2$ atmosphere as described above, to reduce the number of crystal defects in the polycrystalline silicon film. In this case, the above heat treatment is also preferably performed at a low temperature considering that the melt recrystallization step is a low temperature process, while the heat treatment may alternatively be performed at a high temperature of about 1000° C.

When RTA is employed as the melt recrystallization, an Xe lamp may be mounted on an upper part of the quartz window 85 in the device shown in FIG. 16. A lamp input is set at a level of about below 600 W and the substrate temperature is set at about 500 to 600° C., for melting and recrystallizing the amorphous silicon film thereby obtaining a polycrystalline silicon film. Thereafter a heat treatment step can be performed similarly to the above.

A polycrystalline silicon film which is fabricated by the inventive process or a TFT employing the polycrystalline silicon film is applicable to various devices which are fabricated through low temperature processes, in particular. Thus, the same can be applied not only to an LCD but to a switching element for a CCD (charge-coupled device), an SRAM (static random access memory) and the like. Also when occurrence of a defect such as migration may result from crystal defects in a film in a polycrystalline silicon wire or the like, the fabrication process for a polycrystalline silicon film according to the present invention and the polycrystalline silicon film fabricated by this process can be employed.

While a polycrystalline silicon film is employed as a semiconductor film in each of the aforementioned embodiments, the present invention is also applicable to semiconductor films of compounds belonging to the groups II–VI, III–V, IV—IV and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of treating an amorphous semiconductor film to reduce impurity concentration therein, comprising simultaneously heating and oxidizing a surface of said amorphous semiconductor film in an atmosphere containing wet oxygen to crystallize said amorphous semiconductor film to be a polycrystalline film and simultaneously form an oxide film on said surface so that impurity concentration in said semiconductor film is reduced, and removing the thus formed oxide film from said surface, wherein the impurity is oxygen.

2. A method of treating an amorphous semiconductor film in accordance with claim 1, wherein said amorphous semiconductor film is crystallized by solid-phase epitaxy or melt recrystallization.

3. The method of treating a semiconductor film in accordance with claim 1, wherein said semiconductor film is a silicon film.

4. A method of fabricating a semiconductor device with reduced impurity concentration therein, comprising the steps of:

forming an amorphous semiconductor film on a substrate;
simultaneously heating and oxidizing a surface of said amorphous semiconductor film in an atmosphere containing wet oxygen, thereby crystallizing said amorphous semiconductor film to be a polycrystalline film and simultaneously forming an oxide film on an exposed surface of said semiconductor film and reducing impurity concentration in said semiconductor film; and
removing said oxide film formed on said surface of said semiconductor film, wherein the impurity is oxygen.

5. The method of fabricating a semiconductor device in accordance with claim 4, wherein said amorphous semiconductor film is crystallized by solid-phase epitaxy or melt recrystallization.

6. The method of fabricating a semiconductor device in accordance with claim 4, wherein said semiconductor film is a silicon film.

7. A method of fabricating a thin film transistor having a semiconductor film with reduced impurity concentration as an active layer, said semiconductor film being obtained by forming an amorphous semiconductor layer on a substrate and heat treating said amorphous semiconductor film, thereby crystallizing said amorphous semiconductor film, and said method comprising the steps of:

performing a heat treatment in an atmosphere containing water oxygen, thereby crystallizing said amorphous semiconductor layer to be a polycrystalline film, and simultaneously oxidizing a surface thereof to form an oxide film on said surface while reducing impurity concentration in said semiconductor layer; and
removing said oxide film from said surface of said semiconductor film, wherein the impurity is oxygen.

8. A method of fabricating a photovoltaic device having a semiconductor film as a photovoltaic transmittance layer, said semiconductor film having a reduced impurity concentration therein and being obtained by forming an amorphous semiconductor film on a substrate and heat treating said amorphous semiconductor film thereby crystallizing said amorphous semiconductor film, and said method comprising the steps of:

heat treating said amorphous semiconductor film in an atmosphere containing wet oxygen, thereby crystallizing said amorphous semiconductor film to be a polycrystalline film, reducing impurity concentration in said semiconductor film and simultaneously oxidizing a surface thereof to form an oxide film on said surface; and
removing said oxide film from said surface of said semiconductor film, wherein the impurity is oxygen.

* * * * *